(12) United States Patent
Hotta et al.

(10) Patent No.: US 7,737,491 B2
(45) Date of Patent: Jun. 15, 2010

(54) TRENCH GATE FIELD EFFECT DEVICES

(75) Inventors: Koji Hotta, Aichi-ken (JP); Sachiko Kawaji, Owariasahi (JP); Takahide Sugiyama, Aichi-ken (JP); Masanori Usui, Seto (JP)

(73) Assignee: Toyota Jidosha Kabushiki Kaisha, Toyota-shi (JP)

( * ) Notice: Subject to any disclaimer, the term of this patent is extended or adjusted under 35 U.S.C. 154(b) by 1045 days.

(21) Appl. No.: 10/581,664

(22) PCT Filed: Dec. 3, 2004

(86) PCT No.: PCT/JP2004/018432

§ 371 (c)(1),
(2), (4) Date: Jun. 5, 2006

(87) PCT Pub. No.: WO2005/062385

PCT Pub. Date: Jul. 7, 2005

(65) Prior Publication Data

US 2007/0114598 A1    May 24, 2007

(30) Foreign Application Priority Data

Dec. 24, 2003  (JP) ............................. 2003-427768
Mar. 26, 2004  (JP) ............................. 2004-092975

(51) Int. Cl.
    *H01L 29/739*  (2006.01)
(52) U.S. Cl. ............................. 257/330; 257/E29.201
(58) Field of Classification Search .......... 257/E29.201, 257/330
    See application file for complete search history.

(56) References Cited

U.S. PATENT DOCUMENTS 5,463,241 A    10/1995  Kubo
(Continued)

FOREIGN PATENT DOCUMENTS

JP    08-316479 A    11/1996
(Continued)

OTHER PUBLICATIONS

M. Mori, et al.: *A Novel High-Conductivity IGBT (HiGT) with a Short Circuit Capability*, Proceedings of 1998 International Symposium on Power Semiconductor Devices & ICs, Kyoto, Japan, p. 429-432.
(Continued)

*Primary Examiner*—Benjamin P Sandvik
(74) *Attorney, Agent, or Firm*—Kenyon & Kenyon LLP

(57) ABSTRACT

The present invention relates to a technique for reducing the on-voltage of the semiconductor device by increasing the concentration of minority carriers in the deep region (26) and the intermediate region (28). A semiconductor device according to the invention comprises an electrode, a top region (36) of a second conductivity type connected to the electrode, a deep region of the second conductivity type, and an intermediate region of a first conductivity type connected to the electrode. A portion of the intermediate region isolates the top region and the deep region. The semiconductor device further comprises a gate electrode (32) facing the portion of the intermediate region via an insulating layer. The portion facing the gate electrode isolates the top region and the deep region. The semiconductor device according to the invention further comprises a barrier region (40) that is formed within the intermediate region and/or the top region.

11 Claims, 17 Drawing Sheets

U.S. PATENT DOCUMENTS

| | | |
|---|---|---|
| 5,751,024 A | 5/1998 | Takahashi |
| 5,998,268 A * | 12/1999 | Tomatsu et al. ............. 438/271 |
| 6,001,678 A | 12/1999 | Takahashi |
| 6,008,520 A * | 12/1999 | Darwish et al. ............. 257/330 |
| 6,040,599 A | 3/2000 | Takahashi |
| 6,221,721 B1 | 4/2001 | Takahashi |
| 6,518,624 B2 * | 2/2003 | Kim et al. ................... 257/330 |
| 6,518,629 B1 | 2/2003 | Kushida et al. |
| 6,768,168 B1 | 7/2004 | Takahashi |
| 7,112,843 B2 * | 9/2006 | Takaishi ..................... 257/330 |
| 2002/0179968 A1 | 12/2002 | Pfirsch |

FOREIGN PATENT DOCUMENTS

| | | |
|---|---|---|
| JP | 09-270513 A | 10/1997 |
| JP | 10-270693 A | 10/1998 |
| JP | 10-294461 A | 11/1998 |

OTHER PUBLICATIONS

Hideki Nakamura, et al.: *Wide cell pitch 1200V NPT CSTBTs with short circuit ruggedness*, Proceedings of 2001 International Symposium on Power Semiconductor Devices & ICs, Osaka, Japan, pp. 299-302.

* cited by examiner

Concentration of Hole Carriers

PRIOR ART

TRENCH GATE FIELD EFFECT DEVICES

This is a 371 national phase application of PCT/JP2004/018432 filed 03 Dec. 2004.

TECHNICAL FIELD

The present application claims priority to Japanese Patent Application 2003-427768 filed on Dec. 24, 2003 and Japanese Patent Application 2004-092975 filed on Mar. 26, 2004, the contents of which are hereby incorporated by reference.

The present invention relates to a semiconductor device in which electronic current between a pair of electrodes is turned on and turned off by a gate electrode. More specifically, the present invention relates to a technology for decreasing voltage and resistance between the pair of electrodes while a voltage for turning on the semiconductor device is being applied to the gate electrode. The voltage between the pair of the electrodes under this condition will be referred to as on-voltage. The semiconductor device of the invention may be an IGBT, a pnpn diode, a MOS or a MOSFET.

BACKGROUND ART

An IGBT (Insulated Gate Bipolar Transistor) is known in which a MOS structure is provided in a surface face portion of a bipolar transistor. This type of semiconductor device is provided with a pair of electrodes and a gate electrode for turning on and turning off a current flowing between this pair of electrodes. When on-voltage is applied to the gate electrode, electron carriers are injected into a semiconductor region from one of the electrodes, and hole carriers are injected into the semiconductor region from the other of the electrodes. By this means, conductivity modulation occurs in the semiconductor region, and low on-voltage is realized.

Japanese Laid-Open Patent Publication H8 (1996)-316479 (see FIG. 3 in particular) sets forth a technique for reducing on-voltage (voltage between the electrodes when a voltage for turning on the semiconductor device is being applied to the trench gate).

The semiconductor device set forth in Japanese Laid-Open Patent Publication H8 (1996)-316479 is schematically shown in FIG. 17 (in the specification below, this configuration will be termed the conventional configuration). A semiconductor device 15 shown in FIG. 17 is provided with a trench gate 332 for turning on and off a current flowing between a pair of electrodes (in this case, an emitter electrode E and a collector electrode C).

The semiconductor device 15 is provided with: an $n^+$ type emitter region 336 connected with the emitter electrode E, a $p^+$ type body contact region 334 connected with the same emitter electrode E, a $p^-$ type body region 328 that surrounds the body contact region 334 and the emitter region 336, an $n^-$ type drift region 326 located below the body region 328, an $n^+$ type buffer region 324 connected with the drift region 326, and a $p^+$ type collector region 322 connected with the buffer region 324. The collector region 322 is connected with the collector electrode C.

A trench that extends to the drift region 326 passes through the emitter region 336 and the body region 328. A trench gate 332 is formed within this trench. This trench gate 332 is covered by a gate insulating layer 333, and faces, via this gate insulating layer 333, the body region 328 that isolates the emitter region 336 and the drift region 326.

An $n^+$ type barrier region 340 is formed between the body region 328 and the drift region 326. The concentration of impurities in the barrier region 340 is higher than that of the drift region 326.

The semiconductor device shown in FIG. 17 comprises the electrode E, a top region 336, a deep region 326, a dense portion 334, and a main portion 328. The dense portion 334 and the main portion 328 have the same conductivity type and a common voltage, and may be collectively called an intermediate region. A portion of the intermediate region 328 isolates the top region 326 and the deep region 326. The semiconductor device 15 also comprises the trench gate 332 facing the portion of the intermediate region 328 via the insulating layer 333.

The operation of the semiconductor device 15 in an turned on state will be described. When the emitter electrode E is earthed, positive voltage is applied to the collector electrode C and to the trench gate 332, the portion of the body region 328 facing the trench gate 332 is then inverted to the n type and forms a channel. Thereupon, electron carriers are injected, via this channel that was inverted to the n type, from the emitter region 336 to the barrier region 340 and the drift region 326, and accumulate in the buffer region 324. When the electron carriers accumulate in the buffer region 324, the contact potential difference between the buffer region 324 and the collector region 322 decreases, and hole carriers are injected from the collector region 322 to the buffer region 324, the drift region 326, and the barrier region 340. By this means, conductivity modulation occurs in the buffer region 324, the drift region 326, and the barrier region 340, and low on-voltage is realized.

The hole carriers injected from the collector region 322 recombine with the electron carriers and disappear, or are discharged to the emitter electrode E via the body region 328 and the body contact region 334.

In the semiconductor device 15, the barrier region 340 that has a higher concentration of impurities than the drift region 326 is formed above this drift region 326. Consequently, the potential barrier formed in a boundary face between the barrier region 340 and the drift region 326 operates to suppress the hole carriers from escaping to the emitter electrode E. The barrier region 340 increases the density of the hole carriers within the drift region 326 (see FIG. 17). As a result, the concentration of hole carriers between the emitter and the collector electrodes increases, and the on-voltage of the semiconductor device 15 decreases. The barrier region 340 impedes the flow of the hole carriers from the drift region 326 to the emitter electrode E.

DISCLOSURE OF INVENTION

In the semiconductor device 15 set forth in Japanese Laid-Open Patent Publication H8 (1996)-316479, minority carriers that have passed the barrier region 340 and have flowed into the body region 328 are discharged rapidly to the emitter electrode E via the body contact region 334. The concentration of minority carriers in the body region 328 remains low.

In order to further reduce the on-voltage of the semiconductor device, it is necessary to increase the concentration of the minority carriers in not just a drift region 326 (in general terms, the deep region), but also in the body region 328 (in general terms, the intermediate region, and in particular, the main portion of the intermediate region).

The present invention sets forth a technique for further reducing the on-voltage of the semiconductor device by increasing the concentration of minority carriers in the deep region and the intermediate region.

A semiconductor device according to the invention comprises an electrode, a top region of a second conductivity type connected to the electrode, a deep region of the second conductivity type, and an intermediate region of a first conductivity type connected to the electrode. A portion of the intermediate region isolates the top region and the deep region. The semiconductor device further comprises a gate electrode facing the portion of the intermediate region via an insulating layer. The portion facing the gate electrode isolates the top region and the deep region. The intermediate region may comprise a dense portion directly connected to the electrode and a main portion connected to the electrode via the dense portion.

Typically, the electrode may be an emitter electrode, the top region may be an emitter, the dense portion may be a body contact, the main portion may be a body, the deep region may be a drift, and the semiconductor device may be an IGBT. The semiconductor device may also be a MOS, a MOSFET, or a pnpn diode. In a case where the semiconductor device is a MOS, the electrode may be a source electrode, the top region may be a source, the dense portion may be a body contact, the main portion may be a body, and the deep region may be a drift.

The semiconductor device according to the invention further comprises a barrier region that is formed within the intermediate region and/or the top region. The barrier region may be formed by a semiconductor region of the second conductivity type that is electrically disconnected from the electrode and the deep region. The barrier region may also be formed by an insulator. A plurality of barrier regions may be provided within the intermediate region and the top region. Some of the barrier regions may be formed by semiconductor regions of the second conductivity type, and the other barrier regions may be formed by insulating material. The barrier region may be formed at an appropriate place within the intermediate region and the top region. For instance, the barrier region may be enclosed within the main portion of the intermediate region and may be isolated from the top region and the deep region. The barrier region may also be formed along a boundary between the dense potion and the main portion, or may be formed along a boundary between the top region and the main portion. Alternatively, the barrier region may be enclosed within the dense portion or the top region.

The conventional configuration had the problem that there was a low concentration of minority carriers in the intermediate region. In the semiconductor device described above, the barrier region is formed at the intermediate region side of a junction boundary face between the intermediate region and the deep region. This barrier region causes minority carriers to accumulate in the intermediate region. Consequently, the concentration of minority carriers in the intermediate region increases, and the concentration of minority carriers between the pair of electrodes increases. As a result, the on-voltage of the semiconductor device can be reduced.

It may be preferred that the barrier region is connected to the insulating layer for covering the gate electrode. It may also be preferred that the barrier region has an opening through which carriers may flow between the dense portion and the deep region.

When the barrier region causes minority carriers to accumulate in the intermediate region, the potential of the barrier region increases. When the potential of the barrier region increases, majority carriers are supplied from the barrier region towards the intermediate region and the deep region. If the barrier region is formed such that it makes contact with the gate insulating layer, majority carriers are supplied from the barrier region by flowing along a region formed along the gate insulating layer (namely, a channel). As a result, a phenomenon equivalent to a thyristor turning on is obtained. By this means, the on-voltage of the semiconductor device is further reduced.

In the present invention, the barrier region has an opening through which carriers may flow between the dense portion and the deep region. Minority carriers, which were caused by the barrier region to accumulate in the intermediate region, are discharged reliably to the dense portion via this opening. Consequently, the semiconductor device can be turned off in a stable manner.

It may be preferred that the barrier region is formed by a semiconductor region of the first conductivity type along a boundary between the top region and the main portion. The barrier region may be electrically connected to the dense portion and may have a higher concentration of impurities than the main portion. The barrier region may be formed within the top region.

The barrier region formed along the boundary between the top region and the main portion suppresses the minority carriers from being discharged to the electrode via the top region. That is, the latch-up phenomenon is prevented from occurring (wherein the semiconductor device does not turn off even though no potential is being added to the gate electrode).

The latch-up phenomenon readily occurs if the barrier region is formed within the main portion. To deal with this, it is better to have both the barrier region formed along the boundary between the top region and the main portion as well as the barrier region formed within the main portion.

When the barrier region is formed in the vicinity of a boundary between the dense portion and the main portion, an additional barrier region of the second conductivity type may be provided in the vicinity of a boundary between the main portion and the deep region. The additional barrier region may be electrically disconnected from the electrode and the deep region. Alternatively, the additional barrier region may have a higher concentration of impurities than the deep region. The additional barrier region with a higher concentration of impurities may be connected to or separated from the deep region.

The aforementioned semiconductor device allows the concentration of minority carriers to be increased at both a pn junction boundary face between the main portion and the deep region, and within the main portion. By this means, the concentration of minority carriers is increased over a wide range in the main portion, and the concentration of minority carriers between the pair of electrodes is increased. As a result, the on-voltage of the semiconductor device can be reduced.

It is preferred that at least a portion of the barrier region and a portion of the additional barrier region are located on a path along which carriers flow.

It is also preferred that a plurality of barrier regions is formed within the intermediate region. The barrier regions may be distributed within the intermediate region. There is no particular restriction on the shape or location of the barrier regions. For example, these may be located in a localized manner within a face orthogonal to the direction between the pair of electrodes. They may also be located in a spatially dispersed manner within the intermediate region.

It is preferred that the barrier region makes contact with the dense portion. Typically, the barrier region may be formed along a junction face of the dense portion and the main portion. Alternatively, it may be formed within the dense portion.

In this case, the barrier region more effectively accumulates minority carriers. The concentration of minority carriers within the intermediate region increases, and the on-voltage of the semiconductor device decreases.

It is preferred that the film thickness of the top region is less than that of the barrier region.

Forming the barrier region allows the on-voltage of the semiconductor device to be decreased. This in itself should be welcome. However, when the on-voltage is reduced, the saturation current of the semiconductor device simultaneously increases, and the problem thus appears that the semiconductor device can readily be damaged.

In researching the cause of this problem, the present inventors ascertained that the increase in saturation current causes series resistance of the semiconductor device, and that the characteristics of the top region are greatly affected. That is, if the top region has a large supply capacity for majority carriers, a large number of majority carriers are injected from the top region after minority carriers have been accumulated in the intermediate region. Consequently, the saturation current increases and the semiconductor device is damaged. As a result, the present inventors discovered that moderately suppressing the supply capacity for majority carriers of the top region can prevent damage to the semiconductor device. Typically, the supply capacity for majority carriers of the top region can be suppressed by causing the top region to have a small volume. This is achieved by having a low concentration of impurities in the top region, or by causing it to have a small film thickness or width.

Further, it is preferred that the supply capacity for majority carriers of the top region is set to be correlated with the accumulation capacity of the minority carriers of the barrier region. This is because, as described above, if the quantity of accumulation of the minority carriers within the intermediate region is increased, the on-voltage decreases, on the other hand, the semiconductor device is easily damaged. If the film thickness of the top region is less than that of the barrier region, the saturation current of the semiconductor device is prevented from increasing, and damage to the semiconductor device is prevented. Further, the same operational effects can be obtained by adjusting the concentration of impurities in the top region, or the volume thereof, etc.

The semiconductor device of the present invention allows minority carriers to be accumulated within the intermediate region. When the concentration of minority carriers in the intermediate region increases, the on-voltage of the semiconductor device decreases.

BEST MODE FOR CARRYING OUT THE INVENTION

Figure 1:
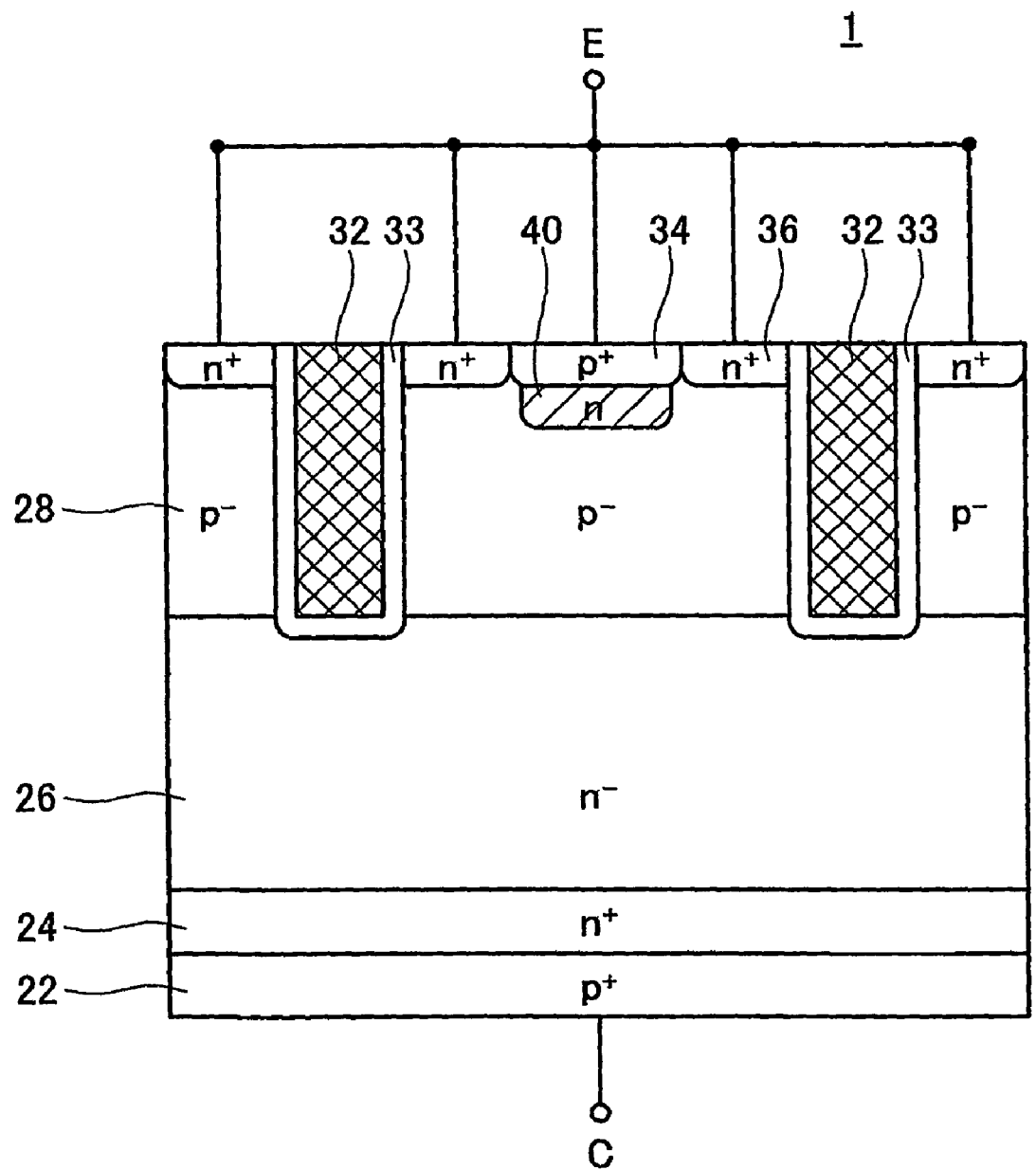
FIG. 1 shows a cross-sectional view of essential parts of a semiconductor device 1 of a first embodiment.

Important features of the embodiments will be listed.

(First Feature)

A semiconductor device of the first feature is an IGBT that comprises:
  an emitter electrode;
  a top region (emitter) of a second conductivity type connected to the emitter electrode;
  a deep region (drift) of the second conductivity type;
  an intermediate region (body and body contact) of a first conductivity type connected to the emitter electrode, a portion of the intermediate region isolating the top region (emitter) and the deep region (drift);
  a collector region of the first conductivity type connected to the deep region (drift) and a collector electrode;
  a gate electrode facing the portion of the intermediate region via an insulating layer, the portion of the intermediate region isolating the top region (emitter) and the deep region (drift); and
  a barrier region formed within the intermediate region (body and body contact) and/or the top region (emitter).

The first conductivity type may be P conductivity type and the second conductivity type may be N conductivity type. Alternatively, the first conductivity type may be N conductivity type and the second conductivity type may be P conductivity type.

(Second Feature)

A semiconductor device of the second feature is a MOSFET that comprises:
  a source electrode;
  a top region (source) of a second conductivity type connected to the source electrode;
  a deep region (drift) of the second conductivity type;
  an intermediate region (body and body contact) of a first conductivity type connected to the source electrode, a portion of the intermediate region isolating the top region (source) and the deep region (drift);
  a drain region of the second conductivity type connected to the deep region (drift) and a drain electrode;
  a gate electrode facing the portion of the intermediate region via an insulating layer, the portion of the intermediate region isolating the top region (source) and the deep region (drift); and a barrier region formed within the intermediate region (body and body contact) and/or the top region (source).

Again, the first conductivity type may be P conductivity type and the second conductivity type may be N conductivity type. Alternatively, the first conductivity type may be N conductivity type and the second conductivity type may be P conductivity type.

(Third Characteristic)

In the IGBT or MOSFET, the intermediate region comprises a dense portion directly connected to the electrode, and a main portion connected to the electrode via the dense portion. A first barrier region is formed in the vicinity of a boundary between the dense portion and the main portion. An additional barrier region is formed in the vicinity of a boundary between the main portion and the deep region.

(Fourth Characteristic)

In the IGBT or MOSFET, the first barrier region is formed by a semiconductor material having the second conductivity type.

(Fifth Characteristic)

In the IGBT or MOSFET, the first-barrier region is disconnected from the electrode and the deep region.

(Sixth Characteristic)

In the IGBT or MOSFET, the additional barrier region has a higher concentration of impurities than the deep region.

(Seventh Characteristic)

In the IGBT or MOS, the additional barrier region has the second conductivity type and is isolated from the deep region.

Embodiments will be described in detail below with reference to figures.

First Embodiment

FIG. 1 shows a cross-sectional view of essential parts of a semiconductor device 1 of a first embodiment. The semiconductor device 1 is provided with a trench gate 32 for turning on and turning off electronic current flowing between an emitter electrode E and a collector electrode C.

The semiconductor device 1 is provided with an emitter region 36 that contains $n^+$ type impurities and makes contact with an emitter electrode E, and a body contact region 34 that contains $p^+$ type impurities and makes contact with the same emitter electrode E. The semiconductor device 1 is provided with a body region 28 that contains $p^-$ type impurities and that surrounds the body contact region 34 and the emitter region 36. A drift region 26 that contains $n^-$ type impurities is formed below the body region 28 and makes contact therewith. The drift region 26 is isolated by the body region 28 from the body contact region 34 and the emitter region 36. A buffer region 24 that contains $n^+$ type impurities is formed below the drift region 26 and makes contact therewith. A collector region 22 that contains $p^+$ type impurities is formed below the buffer region 24. The collector region 22 connects with a collector electrode C consisting of aluminum or the like.

A trench is formed that passes through the emitter region 36 and the body region 28, and extends to the drift region 26. Polysilicon is provided in the trench and a trench gate electrode 32 is formed. The trench gate electrode 32 faces the body region 28 via a gate insulating layer 33.

A floating semiconductor region 40 that contains n type impurities is formed within the body region 28. This floating semiconductor region 40 makes contact with the body contact region 34. The floating semiconductor region 40 is isolated from the emitter electrode E, and is also isolated from the drift region 26. The potential of the floating semiconductor region 40 is not fixed at a particular value, but varies in accordance with the potential of the adjacent parts. This is termed floating.

It is preferred that the concentration of impurities of each semiconductor region is as follows: the collector region 22 is in the range of $1\times10^{18}\sim1\times10^{20}$ cm$^{-3}$, the buffer region 24 is in the range of $1\times10^{15}\sim1\times10^{18}$ cm$^{-3}$, the drift region 26 is in the range of $1\times10^{13}\sim1\times10^{15}$ cm$^{-3}$, the body region 28 is in the range of $1\times10^{15}\sim1\times10^{18}$ cm$^{-3}$, the body contact region 34 is in the range of $1\times10^{18}\sim1\times10^{20}$ cm$^{-3}$, and the emitter region 36 is in the range of $1\times10^{18}\sim1\times10^{20}$ cm$^{-3}$. There is no particular restriction on the concentration of impurities of the floating semiconductor region 40, but it is preferred to be in the range of $1\times10^{15}\sim1\times10^{18}$ cm$^{-3}$. If it is in this range, the minority carriers readily accumulate.

A semiconductor device 1 shown in FIG. 1 comprises an electrode E, a top region 36 (emitter region), a deep region 26 (drift region), a dense portion 34 (body contact region), and a main portion 28 (body region). The dense portion 34 and the main portion 28 have the same conductivity type and a common voltage, and may be collectively called an intermediate region. A portion of the intermediate region 28 isolates the top region 36 (emitter region) and the deep region 26 (drift region). The semiconductor device 1 also comprises the trench gate 32 facing the portion of the intermediate region 28 via the insulating layer 33. The semiconductor device 1 further comprises a barrier region (the floating semiconductor region 40).

Next, the operation of the semiconductor device 1 in a turned on state will be described.

When the emitter electrode E is earthed, positive voltage is applied to the collector electrode C and to the trench gate 32, the part that is in the body region 28 and facing the trench gate 32 is inverted to the n type and forms a channel. Electron carriers are injected to the drift region 26, via this channel that was inverted to the n type, from the emitter region 36. The electron carriers that have been injected into the drift region 26 flow in this drift region 26 towards the collector electrode C, and accumulate in the buffer region 24. When the electron carriers have accumulated in the buffer region 24, the contact potential difference between the buffer region 24 and the collector region 22 decreases, and hole carriers are injected from the collector region 22 to the buffer region 24 and the drift region 26. By this means, conductivity modulation occurs in the buffer region 24 and the drift region 26, and low on-voltage is realized.

The hole carriers injected from the collector region 22 to the drift region recombine with the electron carriers and disappear, or are discharged to the emitter electrode E via the body region 28 and the body contact region 34. In the present embodiment, the floating semiconductor region 40 is located on above the discharge path of the hole carriers.

A potential barrier is formed at a junction boundary face between the floating semiconductor region 40 and the body region 28. The potential barrier impedes the flow of the hole carriers towards the body contact region 34 via the floating semiconductor region 40. The floating semiconductor region 40 forms a barrier region relative to the flow of the hole carriers. By impeding the flow of the hole carriers, the floating semiconductor region 40 aids the accumulation of hole carriers in the body region 28.

The floating semiconductor region 40 of the present embodiment is formed such that it makes contact with the body contact region 34, and is highly effective in impeding the flow of the hole carriers (the minority carriers). As a result, the hole carriers accumulate in the body region 28, and the on-voltage of the semiconductor device 1 decreases.

Second Embodiment

Figure 2:
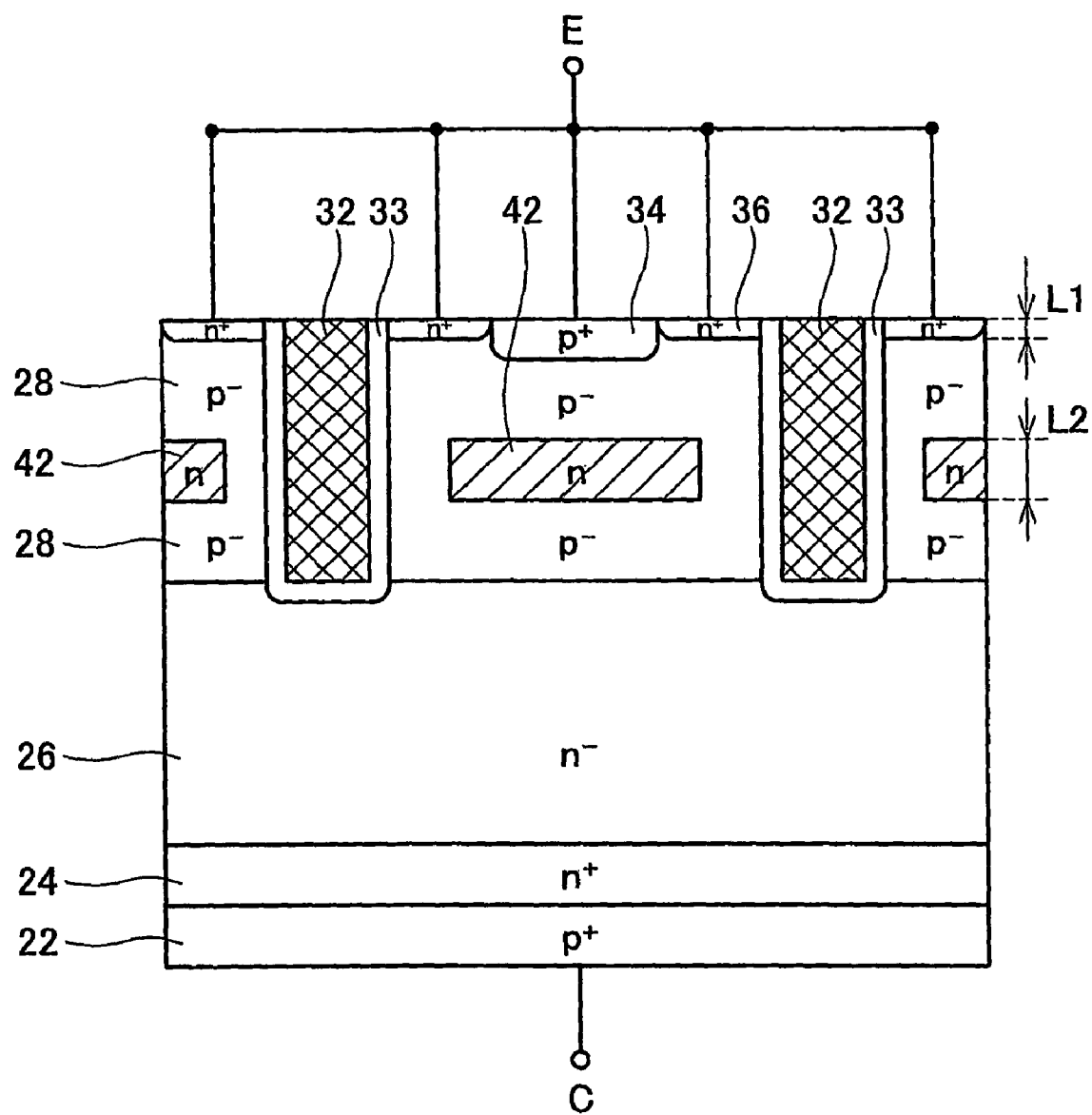
FIG. 2 shows a cross-sectional view of essential parts of a semiconductor device 2 of a second embodiment.

FIG. 2 shows a cross-sectional view of essential parts of a semiconductor device 2 of a second embodiment. Further, configurations identical with those of the semiconductor device 1 of the first embodiment have the same reference numbers assigned thereto and an explanation thereof is omitted.

The figure shows a floating semiconductor region 42 that contains n type impurities. The floating semiconductor region 42 is isolated from the emitter electrode E, and is also isolated from the drift region 26. The potential of the floating semiconductor region 42 is not fixed at a particular value, but varies in accordance with the potential of the adjacent parts.

The floating semiconductor region 42 is located on above the discharge path of the hole carriers, this discharge path linking the drift region 26 and the body contact region 34.

A potential barrier is formed at a junction boundary face between the floating semiconductor region 42 and the body region 28. The potential barrier impedes the flow of the hole carriers towards the body contact region 34. The floating semiconductor region 42 forms a barrier region relative to the flow of the hole carriers. By impeding the flow of the hole carriers, the floating semiconductor region 42 aids the accumulation of hole carriers in the body region 28.

The characteristic of the present embodiment is that the film thickness (L1) of the emitter region 36 is less than the film thickness (L2) of the floating semiconductor region 42. While hole carriers are accumulating in the body region 28 due to the floating semiconductor region 42, electron carriers are being supplied to the body region 28 from the emitter region 36, and the on-voltage of the semiconductor device 2 is reduced. However, if the supply capacity of the electron carriers from the emitter region 36 is too large, the saturation current may increase and damage to the semiconductor device could readily occur. The supply capacity of the electron carriers from the emitter region 36 is related to the quantity of impurities contained in that region. Consequently, the supply capacity of the electron carriers can be made low by implementing measures such as causing a low concentration of impurities in the emitter region 36, causing the region to have a low volume, causing the emitter region 36 to be dispersed, etc. Damage to the semiconductor device can be prevented by making the electron carriers of the emitter region 36 have a low supply capacity. Further, it is preferred that the supply capacity of the electron carriers of the emitter region 36 is set with respect to its relationship with the accumulation capacity of the hole carriers, this being caused by the floating semiconductor region 42. For example, it is better to prevent damage to the semiconductor device 2 by decreasing the supply capacity of the electron carriers of the emitter region 36 in relationship with an increase in the accumulation capacity of the hole carriers of the floating semiconductor region 42.

In the present embodiment, the accumulation capacity of the hole carriers and the supply capacity of the electron carriers are adjusted by setting the film thickness (L1) of the emitter region 36 to be less than the film thickness (L2) of the floating semiconductor region 42. By forming these components in the above relationship, the on-voltage is reduced, and damage to the semiconductor device 2 can be prevented.

As described above, the accumulation effect of the hole carriers and the supply capacity of the electron carriers may be adjusted. Both may be adjusted by, for example, varying the volume of the emitter region 36, or varying the concentration of impurities therein.

Third Embodiment

Figure 3:
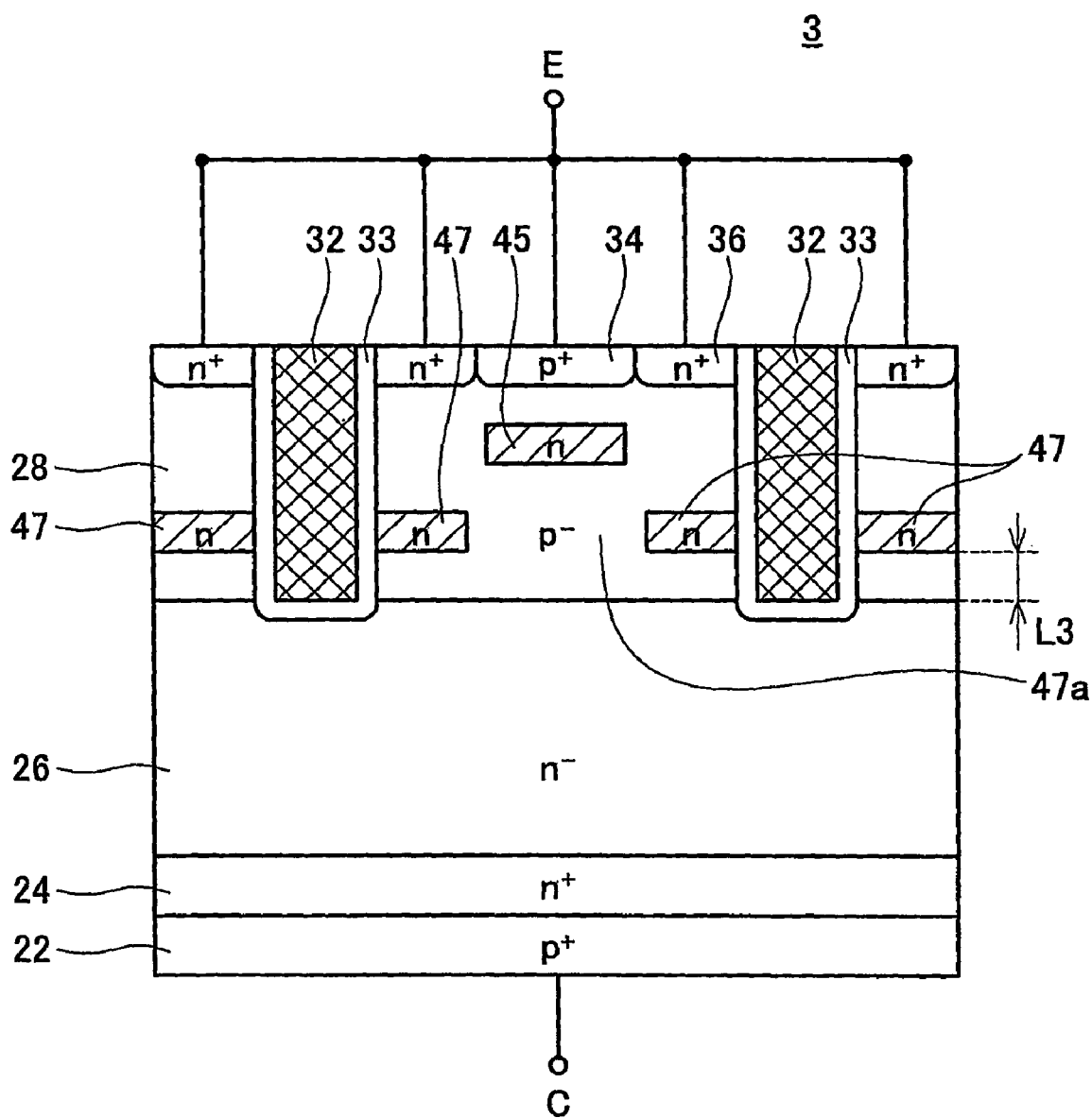
FIG. 3 shows a cross-sectional view of essential parts of a semiconductor device 3 of a third embodiment.

FIG. 3 shows a cross-sectional view of essential parts of a semiconductor device 3 of a third embodiment.

45 in the figure is a floating semiconductor region. The floating semiconductor region 45 is located on above the discharge path of the hole carriers, this discharge path linking the drift region 26 and the body contact region 34.

47 in the figure is also a floating semiconductor region. The floating semiconductor region 47 is characterized in being formed so as to make contact with the gate insulating layer 33.

The floating semiconductor regions 45 and 47 are isolated from the emitter electrode E, and are also isolated from the drift region 26. The potential of the floating semiconductor regions 45 and 47 is not fixed at a particular value, but varies in accordance with the potential of adjacent parts.

A potential barrier is formed at a junction boundary face between the floating semiconductor regions 45 and 47 and the body region 28. The potential barrier impedes the flow of the hole carriers towards the body contact region 34. The floating semiconductor regions 45 and 47 form a barrier region relative to the flow of the hole carriers. By impeding the flow of the hole carriers, the floating semiconductor regions 45 and 47 aid the accumulation of hole carriers in the body region 28.

Moreover, the floating semiconductor region 47 also realizes a thyristor operation. When the semiconductor device 3 is turned on, hole carriers accumulate in the body region 28 immediately below the floating semiconductor region 47, and the potential of the floating semiconductor region 47 rises. Thereupon, the electron carriers, which are supplied from the emitter region 36 by means of the channel formed along the gate insulating layer 33, spread out in a planar manner using the floating semiconductor region 47, and are injected towards the body region 28 and the drift region 26. The floating semiconductor region 47 thus causes the accumulation of hole carriers and also realizes a thyristor operation. Consequently, the on-voltage is greatly reduced.

Further, forming concentrated floating regions in the body region to realize thyristor operations is a known technique in the prior art. However, the aim of this type of floating semiconductor region of the semiconductor device was only to realize thyristor operations. Consequently, the concentration of impurities was adjusted to be extremely high. As a result, a situation occurred in which excess carriers were accumulated, and the semiconductor device could not be turned off. By contrast, the floating semiconductor region 47 of the present embodiment causes the accumulation of hole carriers, and uses the increase in potential that accompanies this accumulation to realize thyristor operations. Consequently, the floating semiconductor region 47 needs a lower concentration of impurities than in the prior art. Moreover, in order to facilitate thyristor operations, it is preferred that the distance (L3) between the floating semiconductor region 47 and the drift region 26 is short.

Further, another characteristic of the floating semiconductor region 47 is that it does not extend over the entirety of the path linking the body contact region 34 and the drift region 26. In other words, an opening 47a is formed in the floating semiconductor region 47. The opening 47a ensures that the hole carriers have a discharge path. Consequently, the hole carriers accumulated in the body region 28 are discharged reliably to the body contact region 34 via the opening 47a when the semiconductor device is turned off. Instability in turning off the semiconductor device is thus avoided.

Figure 4:
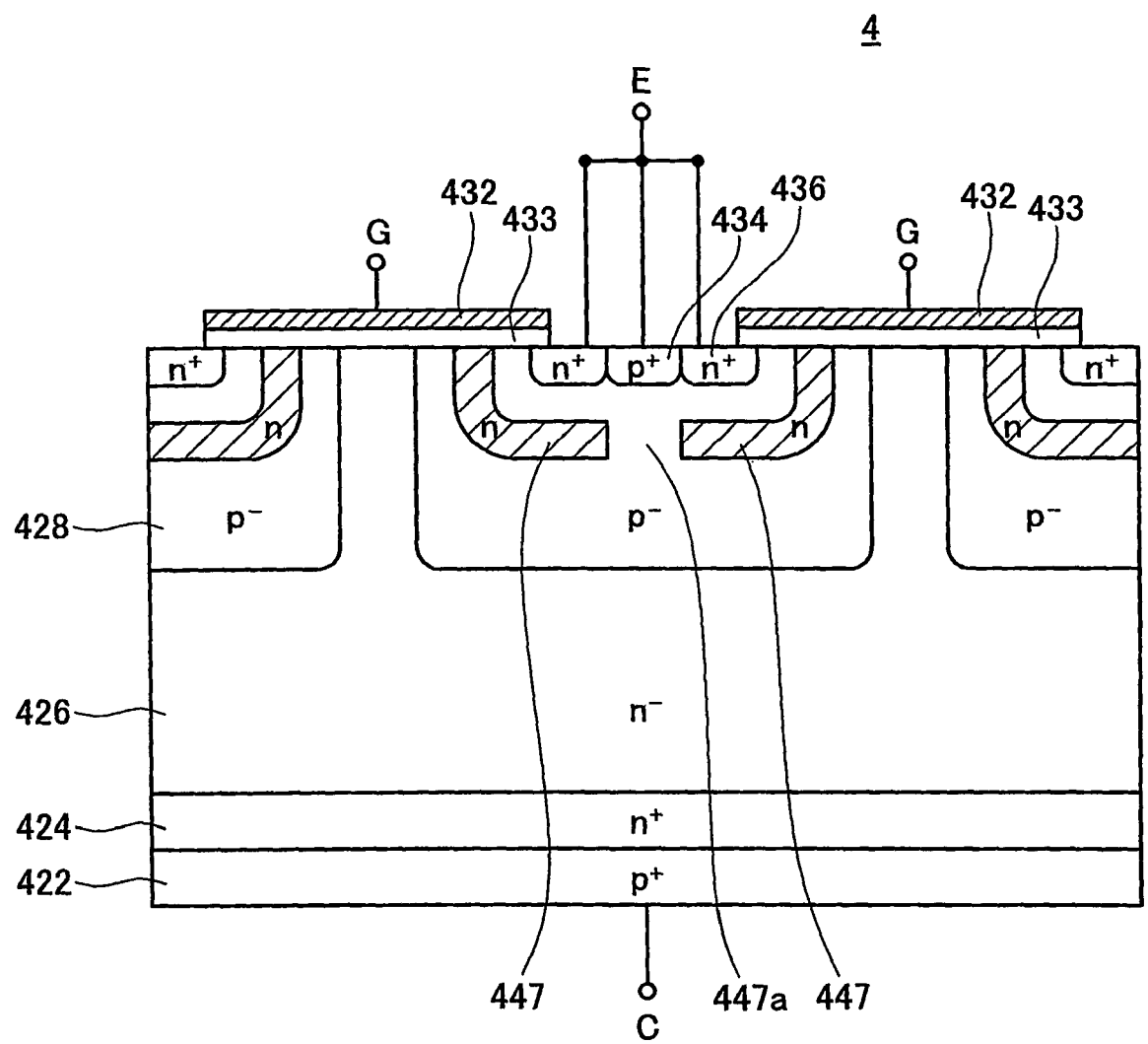
FIG. 4 shows a cross-sectional view of essential parts of a semiconductor device 4 of a transformation of the third embodiment.

FIG. 4 shows a cross-sectional view of essential parts of a semiconductor device 4 of a transformation of the third embodiment. In this transformation, a gate electrode 432 are a planar type.

The figure shows a floating semiconductor region 447 that accumulates hole carriers and realizes a thyristor operation. In this case, the floating semiconductor region 447 makes contact with a gate insulating layer 433, and ensures a discharge path of the hole carriers by means of an opening 447a. Consequently, a reduction in on-voltage and stable operation is realized.

Fourth Embodiment

Figure 5:
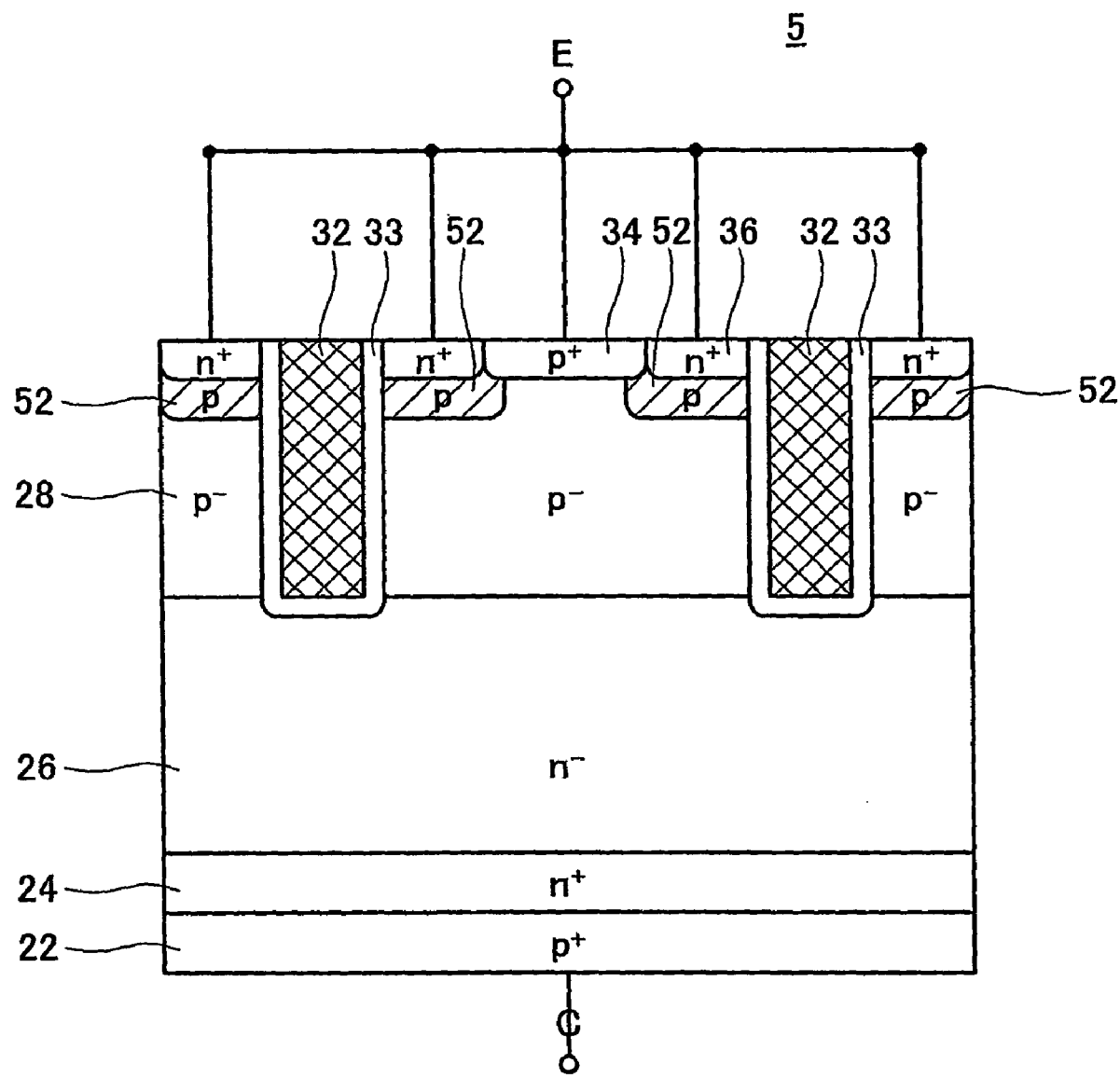
FIG. 5 shows a cross-sectional view of essential parts of a semiconductor device 5 of a fourth embodiment.

FIG. 5 shows a cross-sectional view of essential parts of a semiconductor device 5 of a fourth embodiment.

A characteristic of the present embodiment is that a p type latch-up prevention region 52 is formed between the emitter region 36 and the body region 28. This latch-up prevention region 52 has a higher concentration of impurities than the body region 28. The portion of the latch-up prevention region 52 makes contact with the body contact region 34.

Forming the latch-up prevention region 52 suppresses the flow of hole carriers from the body region 28 towards the emitter region 36. The latch-up prevention region 52 forms a barrier region relative to the flow of the hole carriers. By impeding the flow of the hole carriers, the latch-up prevention region 52 aids the accumulation of hole carriers in the body region 28. Furthermore, the latch-up prevention region 52 suppresses the hole carriers accumulated in the body region 28 from being discharged to the emitter region 36.

The hole carriers are discharged to the body contact region 34 along contacting faces of the latch-up prevention region 52 and the body contact region 34. Providing the latch-up prevention region 52 allows the on-voltage of the semiconductor device to be reduced. For the purpose of comparison, a case wherein the latch-up prevention region 52 is not provided can be considered. If the concentration of minority carriers accumulated in the body region 28 is increased by reducing the concentration of impurities in this body region 28, the latch-up phenomenon occurs due to the accumulated minority carriers flowing to the emitter region 36, and the semiconductor device is destroyed. This latch-up phenomenon occurs readily when the on-voltage is reduced.

By forming the latch-up prevention region 52 of the present embodiment, the on-voltage can be reduced while the latch-up phenomenon can simultaneously be prevented. Since the latch-up phenomenon is prevented, the concentration of impurities in the body region 28 can be reduced adequately and consequently a greater concentration of hole carriers can be accumulated in the body region 28. The on-voltage of the semiconductor device can be reduced.

Fifth Embodiment

Figure 6:
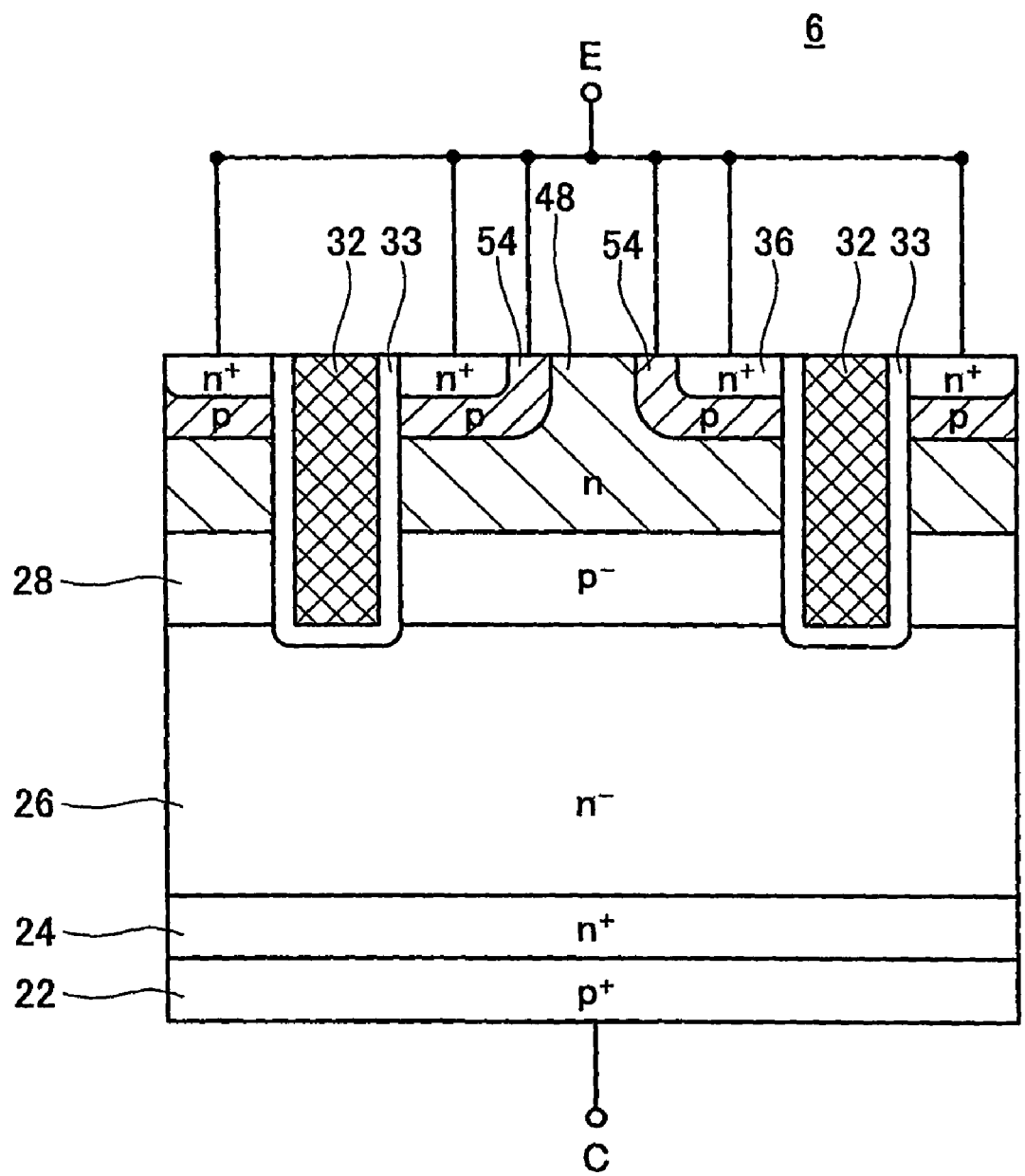
FIG. 6 shows a cross-sectional view of essential parts of a semiconductor device 6 of a fifth embodiment.

FIG. 6 shows a cross-sectional view of essential parts of a semiconductor device 6 of a fifth embodiment.

54 is a p type latch-up prevention region. The latch-up prevention region 54 surrounds the emitter region 36. Furthermore, the latch-up prevention region 54 is directly connected with the emitter electrode E. Consequently, the hole carriers are discharged to the emitter electrode E via the latch-up prevention region 54.

An n type semiconductor region 48 is formed so as to surround the latch-up prevention region 54. Hole carriers accumulate in this n type semiconductor region 48. Consequently, the on-voltage of the semiconductor device 6 is reduced.

In the present embodiment, a p⁻ type body region 28 is between the n type semiconductor region 48 and an n⁻ type drift region 26. As a result, a depressed layer extends rapidly from these two layers when the semiconductor device 6 has been turned off. Consequently, a rapid turn-off speed can be realized.

Sixth Embodiment

Figure 7:
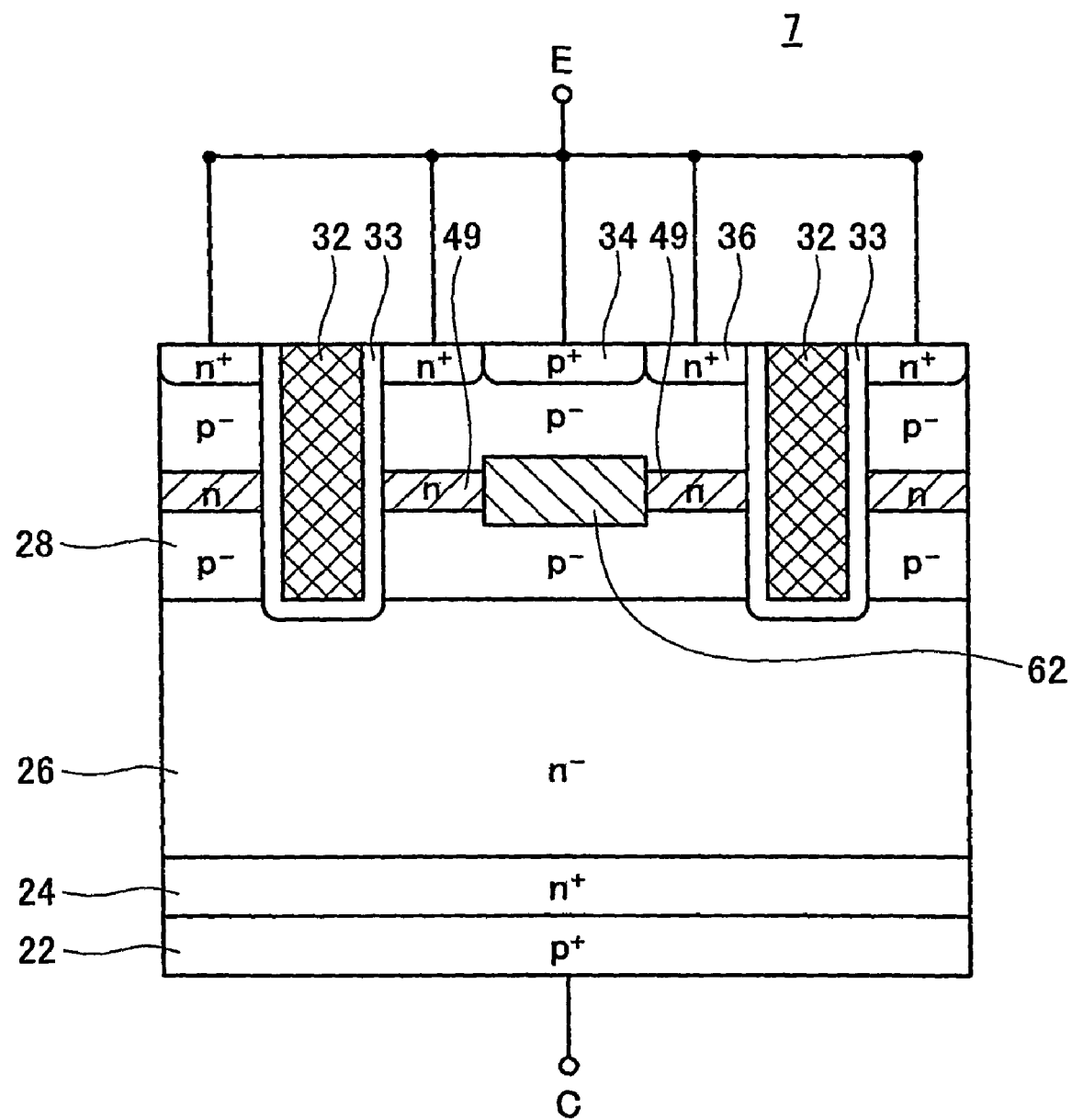
FIG. 7 shows a cross-sectional view of essential parts of a semiconductor device 7 of a sixth embodiment.

FIG. 7 shows a cross-sectional view of essential parts of a semiconductor device 7 of a sixth embodiment. In the present embodiment, an insulating layer 62 and a floating semiconductor region 49 are utilized simultaneously for accumulating hole carriers. The insulating layer 62 and the floating semiconductor region 49 form a barrier region relative to the flow of the hole carriers. By impeding the flow of the hole carriers, the insulating layer 62 and the floating semiconductor region 49 aid the accumulation of hole carriers in the body region 28.

The insulating layer 62 is located directly below the body contact region 34 so that it intersects the discharge path of the hole carriers from the drift region 26 to the body contact region 34. As a result, it is extremely efficacious in accumulating hole carriers.

The floating semiconductor region 49 is formed at the trench gate electrode 32 side of the insulating layer 62. The concentration of impurities in the floating semiconductor region 49 is comparatively small, and hence it is not particularly efficacious in accumulating hole carriers. However, it is located at a position along the gate insulating layer 33, and consequently it is possible to reduce resistance to the electron carriers flowing along this channel. Further, the hole carriers accumulated in the body region 28 can be discharged via this floating semiconductor region 49 when the semiconductor device 7 is turned off. The turning-off operation can thus be performed stably.

The present embodiment is characterized in that, by using the insulating layer 62 and the floating semiconductor region 49 simultaneously, a semiconductor device can be realized in which the hole carriers are accumulated, the resistance of the electron carriers is reduced and, when the semiconductor device is turned off, the hole carriers are discharged in a well-balanced manner. A semiconductor device provided with the desired characteristics can easily be realized.

Seventh Embodiment

Figure 8:
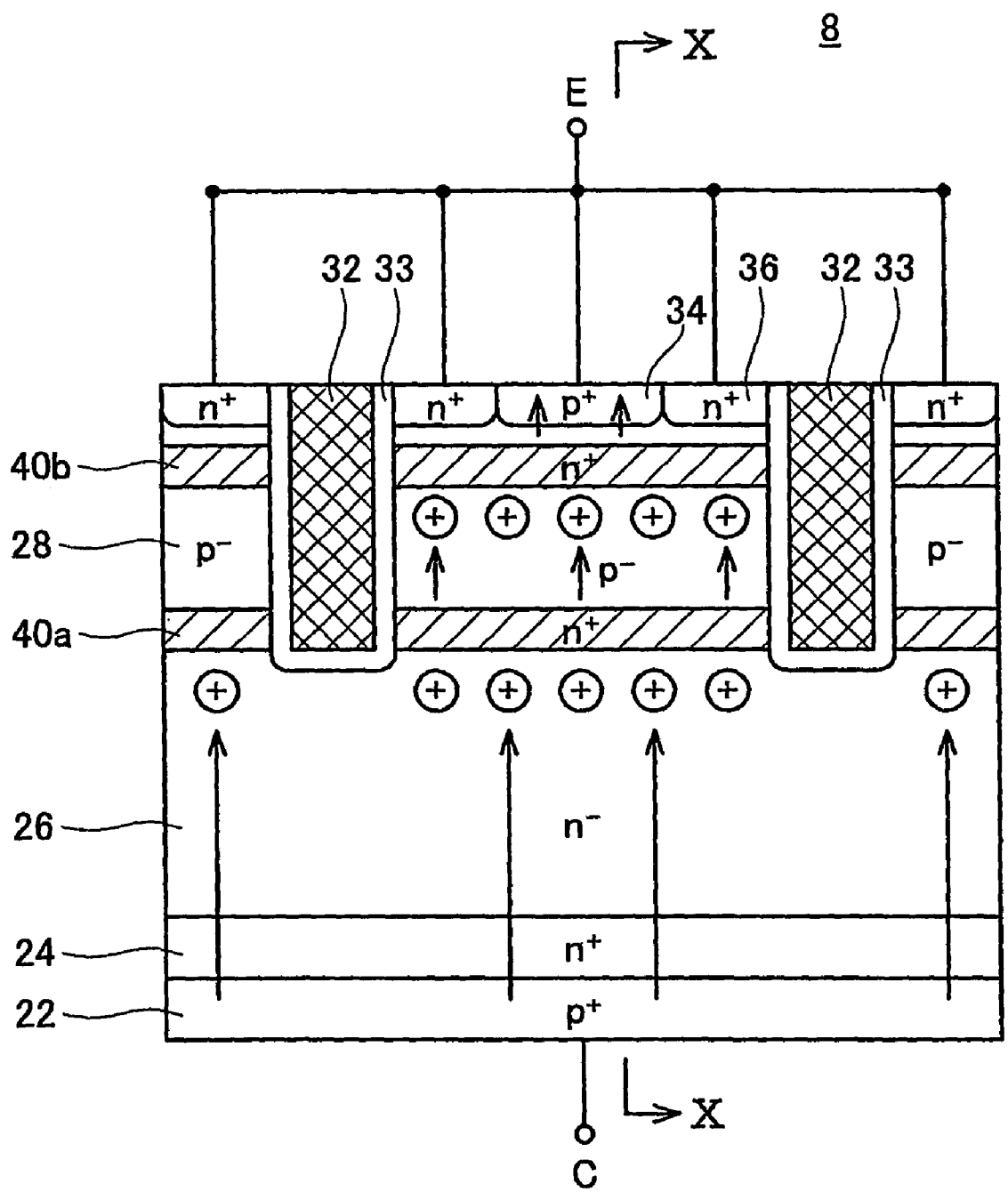
FIG. 8 shows a cross-sectional view of essential parts of a semiconductor device 8 of a seventh embodiment.

FIG. 8 shows a cross-sectional view of essential parts of a semiconductor device 8 of a seventh embodiment. In the present embodiment, semiconductor regions that accumulate hole carriers are formed in multiple layers, thus further increasing the concentration of hole carriers in the body region 28.

An n⁺ type first floating semiconductor region 40b is formed in the vicinity of a pn junction boundary face between the body contact region 34 and the body region 28. Moreover, an n⁺ type concentrated semiconductor region 40a is formed at the boundary face between the drift region 26 and the body region 28. This has a higher concentration of impurities than the drift region 26.

It is preferred that the concentration of impurities in the semiconductor regions is in the range of $1\times10^{15}$~$1\times10^{17}$ cm⁻³ in the concentrated semiconductor region 40a, and $1\times10^{15}$~$1\times10^{18}$ cm⁻³ in the first floating semiconductor region 40b.

The first floating semiconductor region 40b and the n+ type concentrated semiconductor region 40a form a barrier region relative to the flow of the hole carriers. By impeding the flow of the hole carriers, the first floating semiconductor region 40b and the n+ type concentrated semiconductor region 40a aid the accumulation of hole carriers in the body region 28 and the drift region 26.

Figure 9:
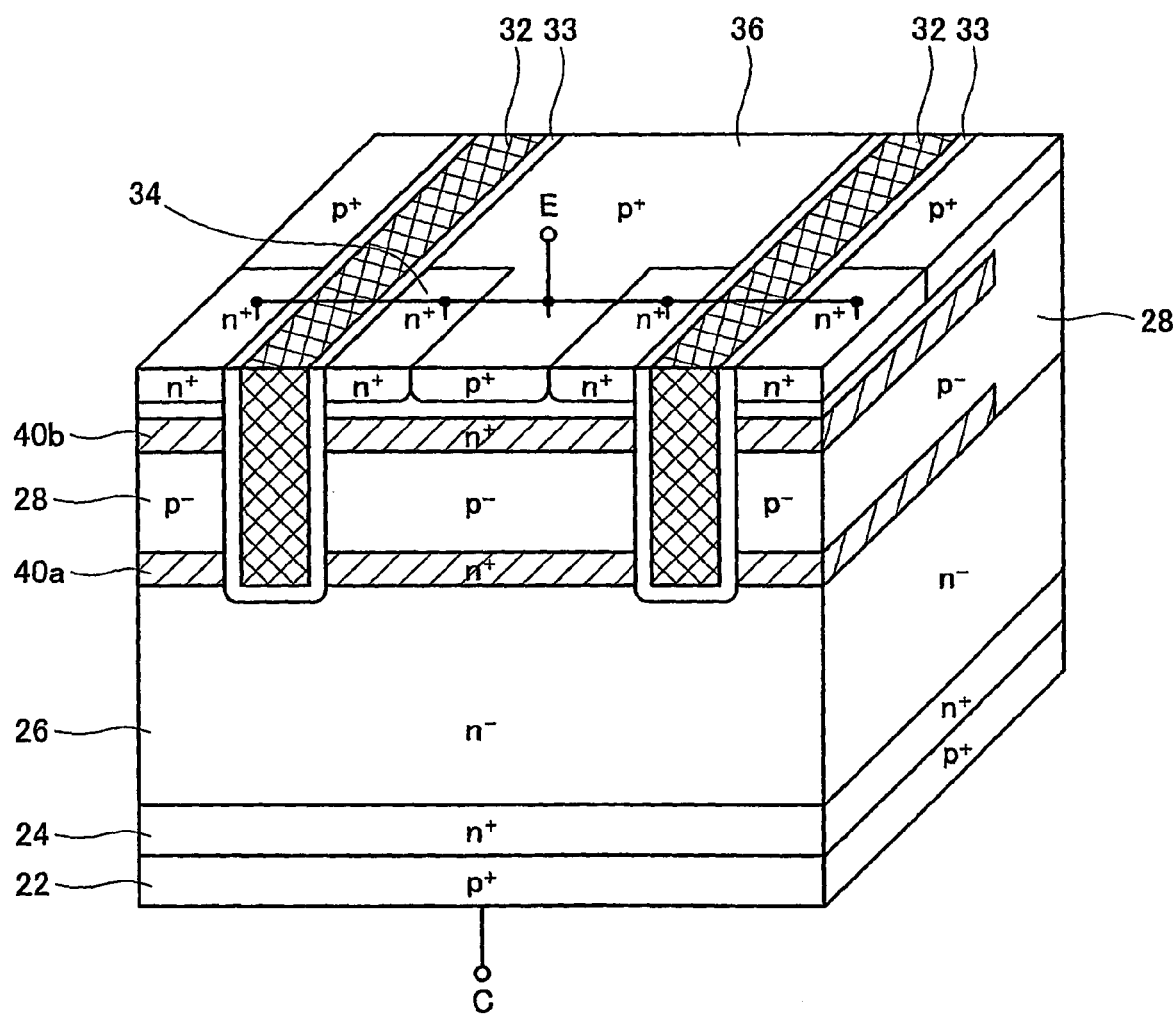
FIG. 9 shows a diagonal view of essential parts of the semiconductor device 8 of the seventh embodiment.

FIG. 9 shows a diagonal view of essential parts of the semiconductor device 8.

The concentrated semiconductor region 40a and the first floating semiconductor region 40b are not formed to extend within the entirety of the body region 28, but are formed in a localized manner below the emitter region 34. The body region 28 below the first floating semiconductor region 40b makes contact with the body contact region 36 that is located inwards relative to the plane of the page, and the body region 28 and the body contact region 36 are maintained at the same potential. In this case, when the semiconductor device 8 has been turned off, the hole carriers accumulated in the body region 28 can be discharged rapidly to the exterior, and switching speed is thus increased.

Instead of this configuration, the body region 28 below the first floating semiconductor region 40b may be in a floating state across the entirety of the chip. That is, it may be separated from the body contact region 36. In this case, the hole carriers that are accumulated within the chip pass through the first floating semiconductor region 40b from the body region 28 that is in a floating state and flow into the body contact region 36. That is, a depressed layer extends to the body region 28 from the first floating semiconductor region 40b and the concentrated semiconductor region 40a, and consequently the body region 28 is depressed rapidly and switching speed is thus increased.

Moreover, it is preferred that, as in the semiconductor device 8, the concentrated semiconductor region 40a and the first floating semiconductor region 40b are located below the body contact region 36 that is in the vicinity of the emitter region 34. The hole carriers that are discharged to the emitter electrode E are attracted to the electron carriers injected from the emitter region 34. Consequently, they tend to be discharged readily to the emitter electrode E from the body contact region 36 in the vicinity of the emitter region 34. Forming the concentrated semiconductor region 40a and the first floating semiconductor region 40b below the body contact region 36 that is in the vicinity of the emitter region 34 means that barrier regions 40a and 40b are located on above the paths of the hole carriers. Forming the semiconductor region 40a and the first floating semiconductor region 40b in these locations means that the hole carriers can be accumulated effectively in the body region 28 and the drift region 26.

Moreover, the concentrated semiconductor region 40a may be formed within the body region 28. If the concentrated semiconductor region 40a is formed within the body region 28, it will have a floating potential. The concentrated semiconductor region 40a tends not to fall within the electric field, and a high breakdown voltage can be realized.

Next, the operation of the semiconductor device 8 in a turned on state will be described.

When the emitter electrode E is earthed, positive voltage is applied to the collector electrode C and to the trench gate 32. The portion of the body region 28 facing the trench gate 32 is then inverted to the n type and forms a channel. Thereupon, electron carriers are injected, via this channel that was inverted, from the emitter region 34 to the drift region 26. The electron carriers injected to the drift region 26 flow towards the collector electrode C side of the drift region 26, and accumulate in the buffer region 24. When the electron carriers accumulate in the buffer region 24, the contact potential difference between the buffer region 24 and the collector region 22 decreases, and hole carriers are injected from the collector region 22 to the buffer region 24 and the drift region 26. By this means, conductivity modulation occurs in the buffer region 24 and the drift region 26, and the on-voltage of the semiconductor device decreases.

The hole carriers injected from the collector region 22 recombine with the electron carriers and disappear, or are discharged to the emitter electrode E via the body region 28 and the body contact region 34. FIG. 8 schematically shows the hole carriers discharged to the emitter electrode E.

The potential barrier formed in a junction boundary face between the concentrated semiconductor region 40a and the drift region 26 aid the accumulation of hole carriers in the drift region 26. A potential barrier is formed at a junction boundary face between the first floating semiconductor region 40b and the body region 28. The hole carriers that pass the potential barrier of the junction boundary face between the concentrated semiconductor region 40a and the drift region 26, and flow into the body region 28, are accumulated within this body region 28 that is in the vicinity of the junction boundary face between the first floating semiconductor region 40b and the body region 28. The hole carriers that pass the potential barrier of this junction boundary face are discharged to the emitter electrode E.

Figure 10:
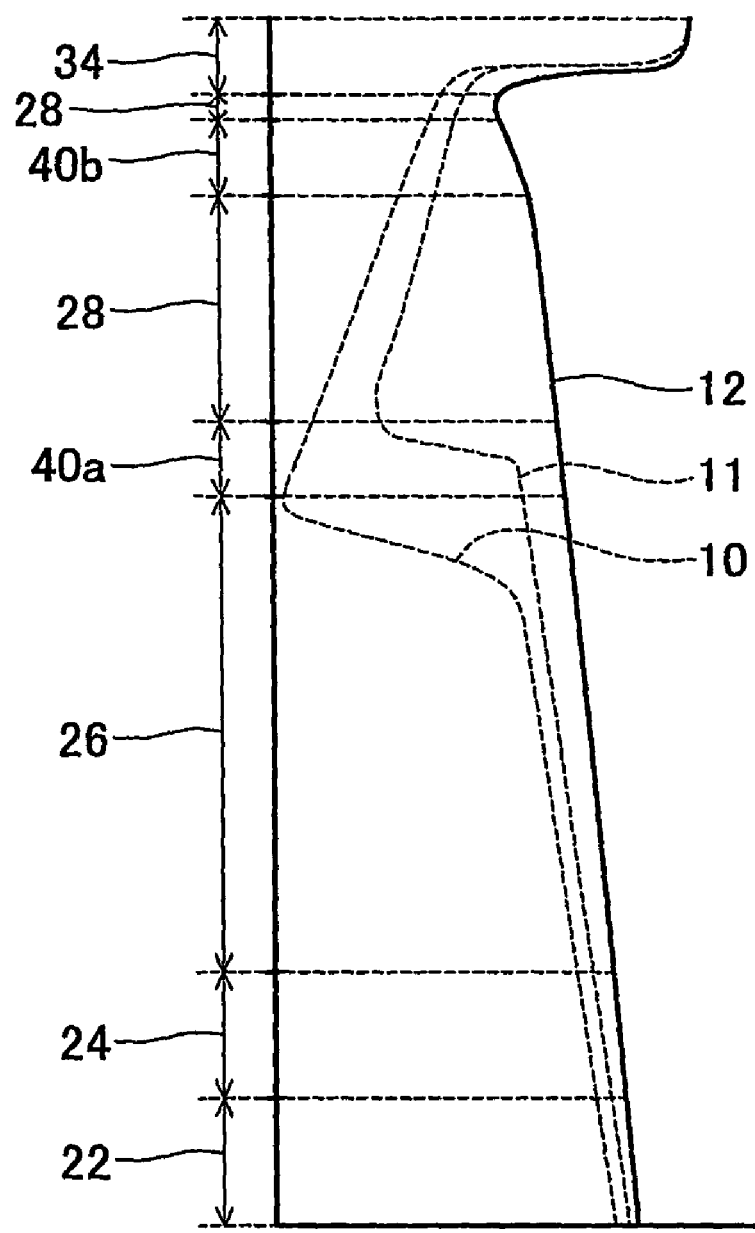
FIG. 10 shows the distribution of concentration of hole carriers between an emitter electrode and a collector electrode.

FIG. 10 shows the distribution of concentration of hole carriers between the emitter electrode and the collector electrode, this corresponding to the line X-X of FIG. 8, from the body contact region 34, through the first floating semiconductor region 40b, the body region 28, the concentrated semiconductor region 40a, the drift region 26, the buffer region 24, to the collector region 22.

The upper edge of the figure is the emitter electrode E, the lower edge of the figure is the collector electrode C, and the numbers corresponding to each of the regions are on the left edge of the figure. The horizontal axis is the concentration of hole carriers, with the concentration of hole carriers increasing towards the left side.

Further, the curve 12 in FIG. 10 is the concentration of hole carriers between the emitter and the collector electrodes of the semiconductor device 8 of the seventh embodiment, the curve 11 is the concentration of hole carriers of the conventional configuration (corresponding to the case in which only the concentrated semiconductor region 40a is formed), and the curve 10 is the concentration of hole carriers in the case where the first floating semiconductor region 40b and the concentrated semiconductor region 40a are not formed.

First, observing the case shown by the curve 10, in which the first floating semiconductor region 40b and the concentrated semiconductor region 40a are not formed, there is an extremely reduced concentration of hole carriers at a pn junction boundary face of the body region 28 and the drift region 26. Furthermore, it is clear that the concentration of hole carriers remains low across the entirety of the body region 28. It is also clear that the concentration of hole carriers within the drift region 26 decreases from the collector region 22 side to the emitter region 36 side.

In the case of the curve 11 showing the conventional configuration, a concentrated semiconductor region (corresponding to 40a) is formed at the junction boundary face of the body region 28 and the drift region 26. The concentration of hole carriers at this junction boundary face is consequently higher than curve 10. However, it is clear that the concentration of hole carriers remains low across the entirety of the body region 28. Consequently, in the conventional configuration, the hole carriers that pass the potential barrier formed by the semiconductor region (corresponding to 40*a*) formed at the junction boundary face of the body region 28 and the drift region 26, and that flow into the body region 28, are immediately discharged to the emitter electrode. Further, in the conventional configuration, also, the concentration of hole carriers within the drift region 26 decreases from the collector region 22 side to the emitter region 36 side.

By contrast it is clear, when observing the case shown by the curve 12 of the semiconductor device 8 of the seventh embodiment, that the concentration of the hole carriers remains high across the entirety of the body region 28. Furthermore, in the drift region 26, the hole carriers, which decrease in concentration from the collector region 22 side to the emitter region 36 side, decrease more gently than in the conventional configuration. Consequently, there is a higher concentration of hole carriers along the entire distance between the emitter and the collector electrodes. Due to this, the on-voltage of the semiconductor device 8 is lower than in the conventional configuration.

When the semiconductor device 8 of the seventh embodiment is turned off, a depressed layer spreads to the body region 28 from the concentrated semiconductor region 40*a* and the first floating semiconductor region 40*b*. A wider region in the body region 28 can thus be depressed than in the case of a semiconductor device provided only with the concentrated semiconductor region 40*a* (equivalent to the conventional configuration). Consequently, higher breakdown voltage than with the conventional configuration can be realized. Further, in the conventional configuration, it is necessary to further increase the concentration of impurities in the region corresponding to the concentrated semiconductor region 40*a* if it is to be made more effective in accumulating hole carriers. If this is done, there is the problem that an electric field cannot be maintained at the pn junction boundary face between the concentrated semiconductor region and the body region, and breakdown voltage worsens. In the semiconductor device 8 of the seventh embodiment, the concentration of impurities need not be increased. Consequently, the electric field is not concentrated.

Moreover, the spread of the depressed layer when the semiconductor device is turned off is accompanied by the hole carriers being discharged to the emitter electrode within a short period. The turn-off time is shorter than in the conventional configuration, and switching speed is increased.

Eighth Embodiment

Figure 11:
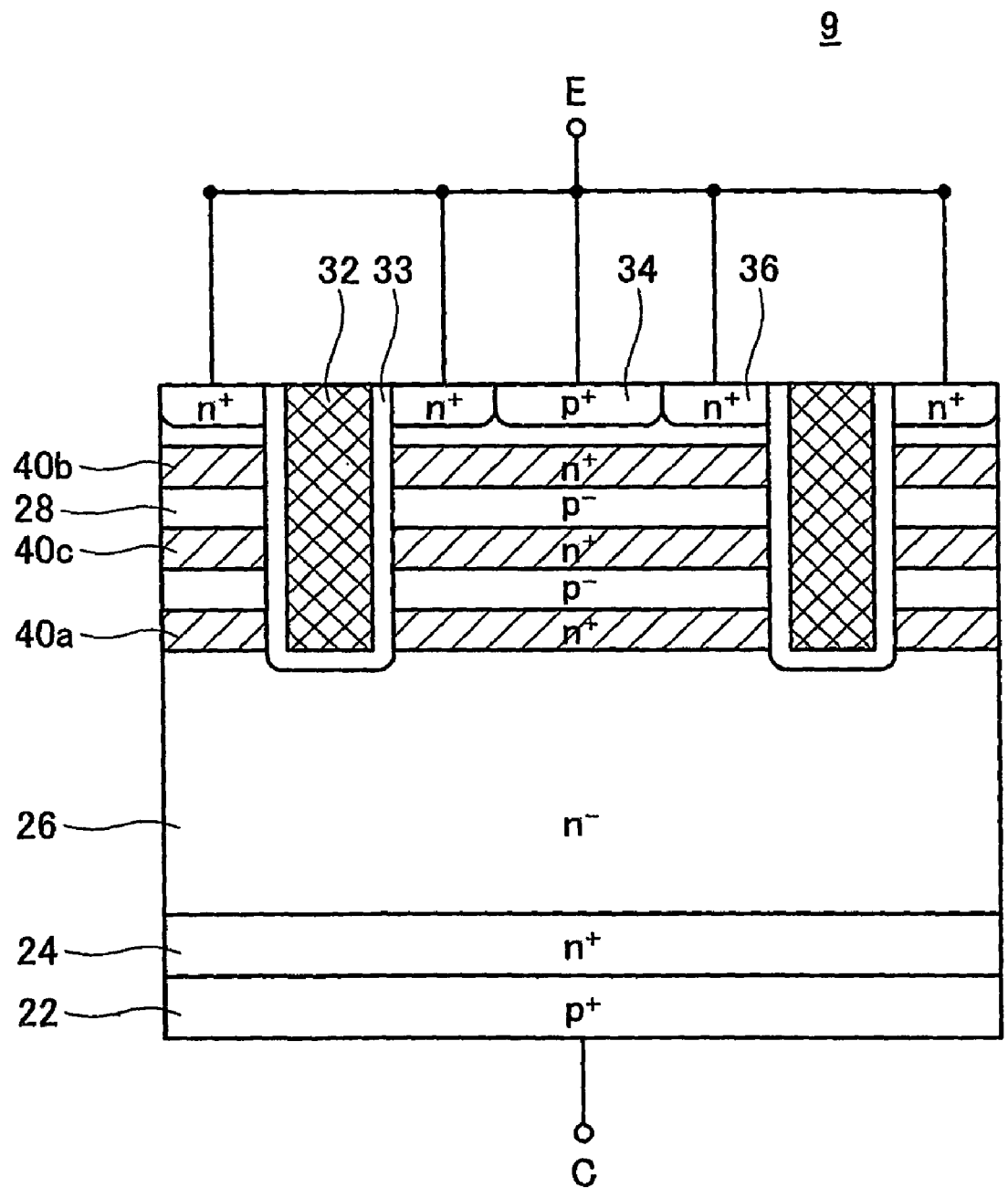
FIG. 11 shows a cross-sectional view of essential parts of a semiconductor device 9 of an eighth embodiment.

A semiconductor device 9 of an eighth embodiment, shown in FIG. 11, is a case that corresponds to the semiconductor device 8 of the seventh embodiment, in which a second floating semiconductor region 40*c* has been added to the body region 28. The second floating semiconductor region 40*c* forms a barrier region relative to the flow of the hole carriers. By impeding the flow of the hole carriers, the second floating semiconductor region 40*c* aids the accumulation of hole carriers in the body region 28.

Adding the second floating semiconductor region 40*c* means that the concentration of hole carriers in the body region 28 can be made greater than with the semiconductor device 8 of the seventh embodiment. The on-voltage of the semiconductor device 9 can be reduced further. Moreover, the second floating semiconductor region 40*c* also has the effect of depressing the body region 28 when the semiconductor device 9 is turned off, breakdown voltage is thus increased, and the turn-off time is reduced.

Ninth Embodiment

Figure 12:
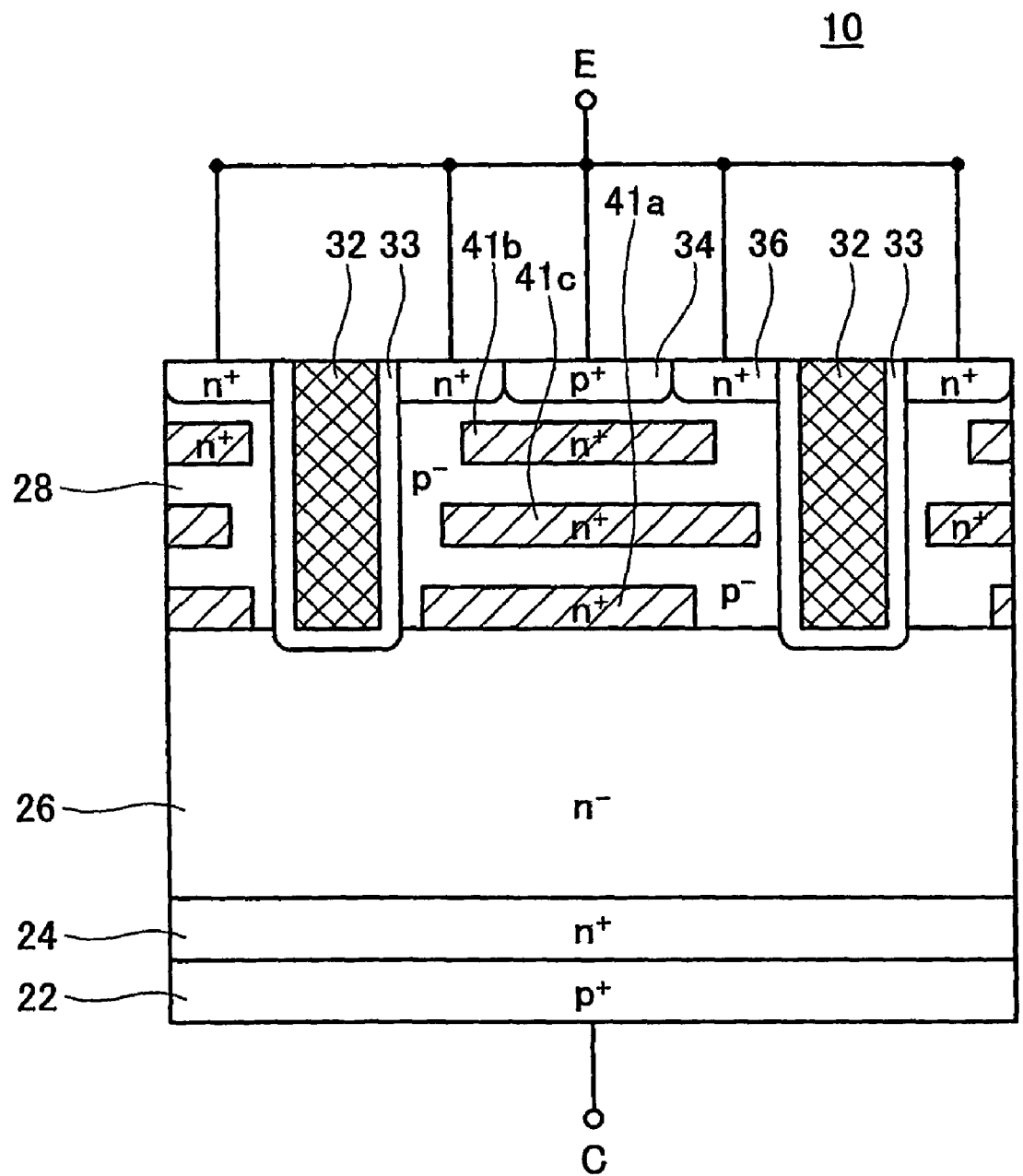
FIG. 12 shows a cross-sectional view of essential parts of a semiconductor device 10 of a ninth embodiment.

A semiconductor device 10 of a ninth embodiment, shown in FIG. 12, is a case in which a concentrated semiconductor region 41*a* and floating semiconductor regions (41*b*, 41*c*) do not make contact with the gate insulating layer 33 of the trench gate electrode 32.

A potential barrier is formed at the junction boundary face of the concentrated semiconductor region 41*a* and the drift region 26. A potential barrier is also formed at the junction boundary face of the floating semiconductor regions (41*b*, 41*c*) and the body region 28. These potential barriers impede the flow of hole carriers towards the body contact region 34. The concentrated semiconductor region 41*a* and the floating semiconductor regions (41*b*, 41*c*) form a barrier region relative to the flow of the hole carriers. By impeding the flow of the hole carriers, the concentrated semiconductor region 41*a* and the floating semiconductor regions (41*b*, 41*c*) aid the accumulation of hole carriers in the drift region 26 and the body region 28.

Even though the concentrated semiconductor region 41*a* and the floating semiconductor regions (41*b*, 41*c*) do not make contact with the gate insulating layer 33 of the trench gate electrode 32, semiconductor region 41*b* are formed in the vicinity of the junction boundary face of the body contact region 34 and the body region 28, and semiconductor region 41*a* in the vicinity of the junction boundary face of the body region 28 and the drift region 26. Consequently, the on-voltage of the semiconductor device 10 can be reduced. The second floating semiconductor region 41*c* may also be spatially dispersed within the body region 28.

Tenth Embodiment

Figure 13:
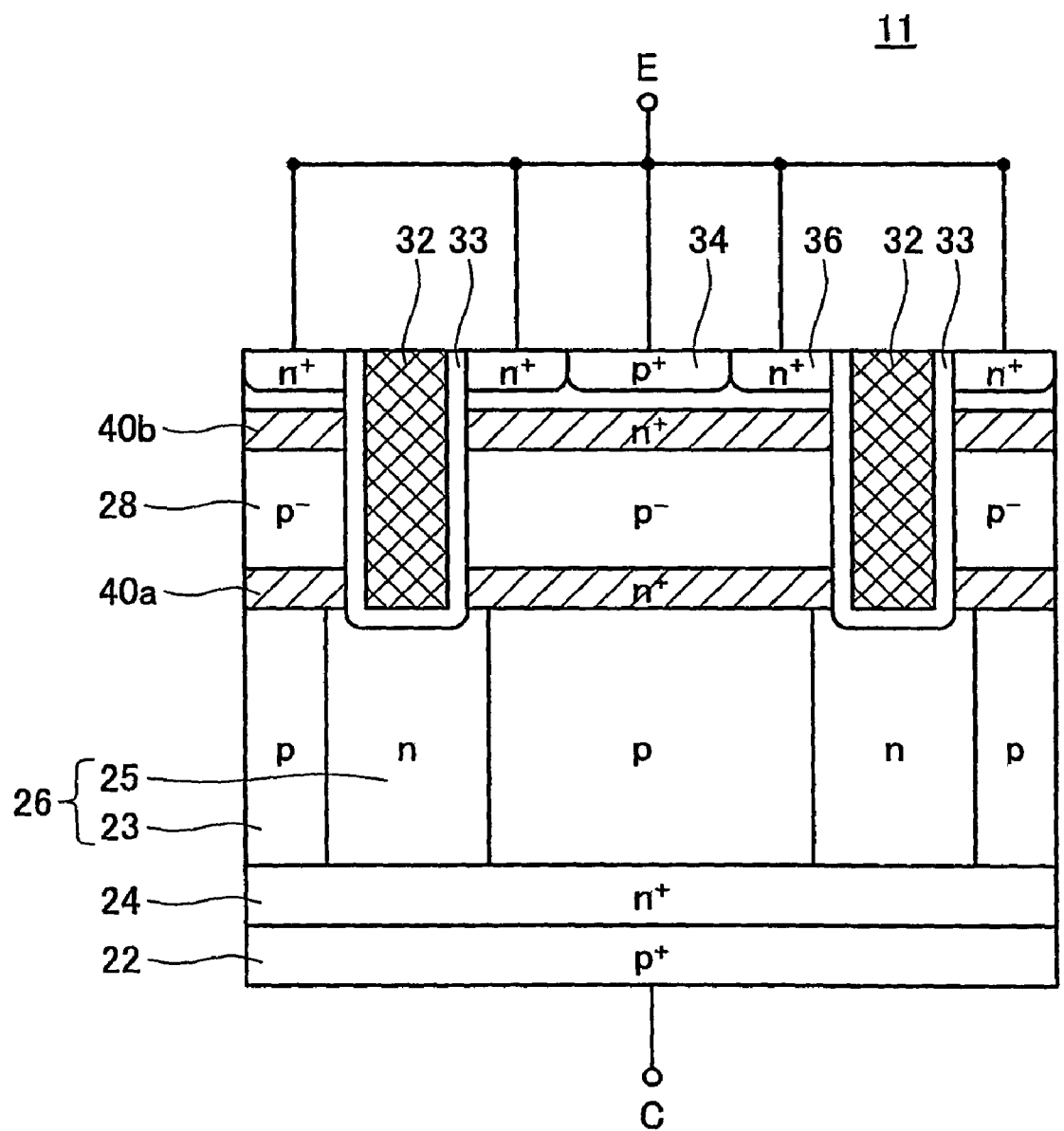
FIG. 13 shows a cross-sectional view of essential parts of a semiconductor device 11 of a tenth embodiment.

A semiconductor device 11 of a tenth embodiment, shown in FIG. 13, is a case in which a so-called super-junction structure is formed in the drift region 26. This super-junction structure comprises an n type column 25 containing n type impurities and a p type column containing p type impurities. It extends in the direction between the emitter and collector electrodes, and the combination of an n type column 25 and a p type column is repeated alternately in a face orthogonal to the direction between the emitter and collector electrodes. The n type columns 25 and the p type columns 23 of the semiconductor device 11 are sheet shaped, so that they are formed in a stripe shape when the face orthogonal to the direction between the emitter and the collector electrodes is viewed cross-sectionally.

The first floating semiconductor region 40*b* and an n$^+$ type concentrated semiconductor region 40*a* provided in this semiconductor device 11 form a barrier region relative to the flow of the hole carriers. By impeding the flow of the hole carriers, the first floating semiconductor region 40*b* and the n$^+$ type concentrated semiconductor region 40*a* aid the accumulation of hole carriers in the body region 28 and the drift region 26. Consequently, the concentration of hole carriers in the body region 28 increases, and the on-voltage of the semiconductor device is reduced. Furthermore, the on-voltage of the drift region 26 can be reduced and the breakdown voltage thereof increased by means of the super-junction structure.

The super-junction structure may be formed such that the n type columns 25 and the p type columns 23 extend in the direction between the emitter and the collector electrodes, and the combination of an n type column 25 and a p type column is repeated alternately in a face orthogonal to the direction between the emitter and the collector electrodes. For example, if the n type columns 25 and the p type columns are sheet shaped, n type part regions and p type part regions are repeated in one direction. If the n type columns 25 and the p type columns 23 have a rectangular column shaped in cross-section, locating each column in a zigzag lattice shape allows a super-junction structure to be obtained in which each column is repeated in two directions. If the n type columns 25 and the p type columns 23 have an orthohexagonal shape in cross-section, locating these columns without space therebetween allows a super-junction structure to be obtained in which each column is repeated in three directions. Alternatively, super-junction structures can be obtained in which n type columns 25 and p type columns 23 are repeated alternately in a face orthogonal to the direction between the electrodes by the following means: p type columns 23 that have a rectangular column shape in cross-section are repeated in two directions, being located with spaces therebetween in n type columns 25 that extend in a planar manner; or p type columns 23 that have an orthohexagonal shape in cross-section are repeated in three directions, being located with spaces therebetween in n type columns 25 that extend in a planar manner.

Eleventh Embodiment

Figure 14:
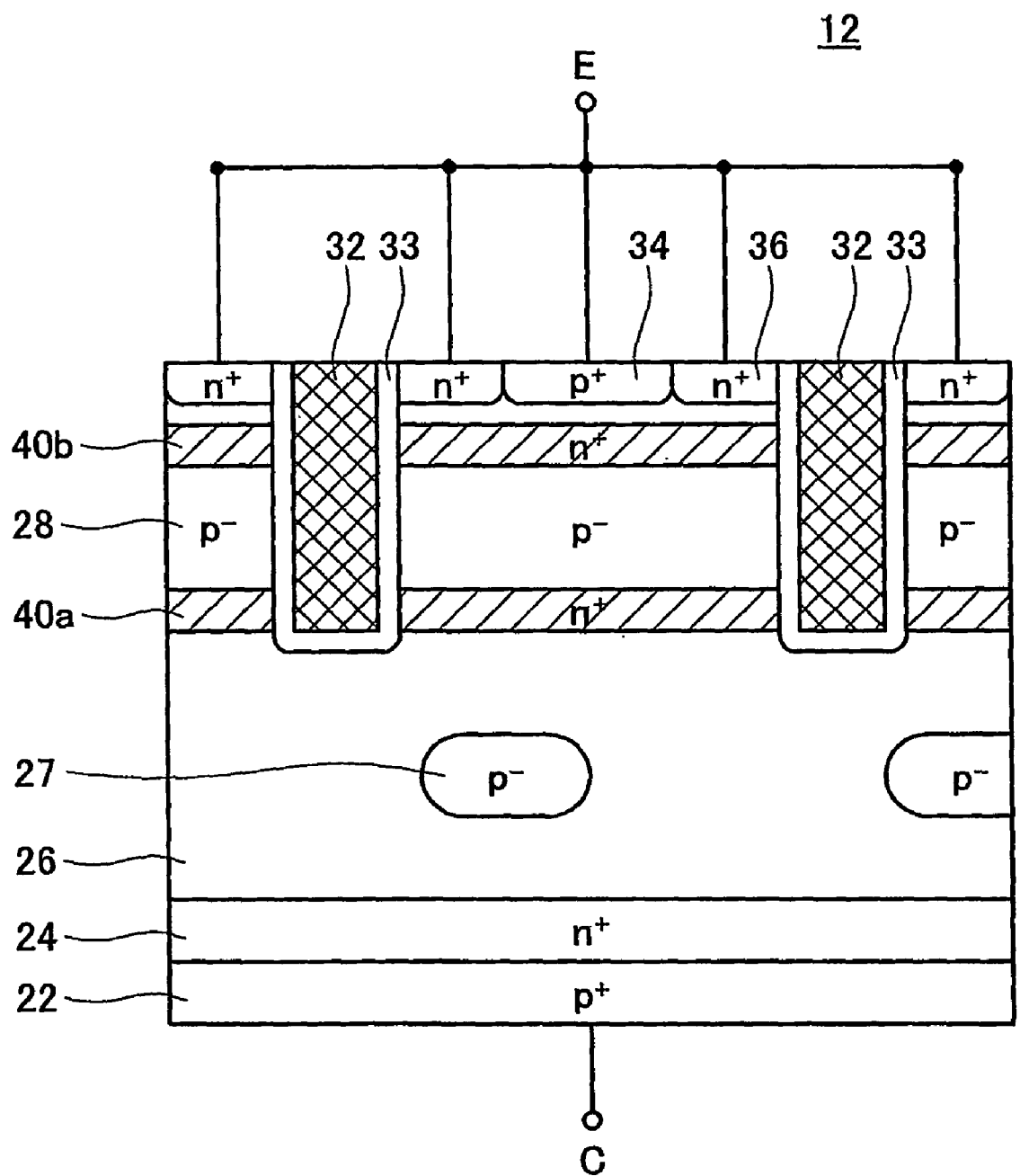
FIG. 14 shows a cross-sectional view of essential parts of a semiconductor device 12 of an eleventh embodiment.

A semiconductor device 12 of an eleventh embodiment, shown in FIG. 14, is a transformation of the tenth embodiment that is provided with the super-junction structure. In this transformation, a p⁻ type floating regions 27 is spatially dispersed within the drift region 26.

In the super-junction structure of the drift region 26, as in the tenth embodiment, n type columns 25 and p type columns 26 are repeated alternately in a face orthogonal to the direction between the emitter and the collector electrodes. In addition, a p type floating regions 27 may be spatially dispersed as in this eleventh embodiment. The on-voltage of the drift region 26 is reduced and the breakdown voltage thereof is increased by means of the super-junction structure.

Twelfth Embodiment

Figure 15:
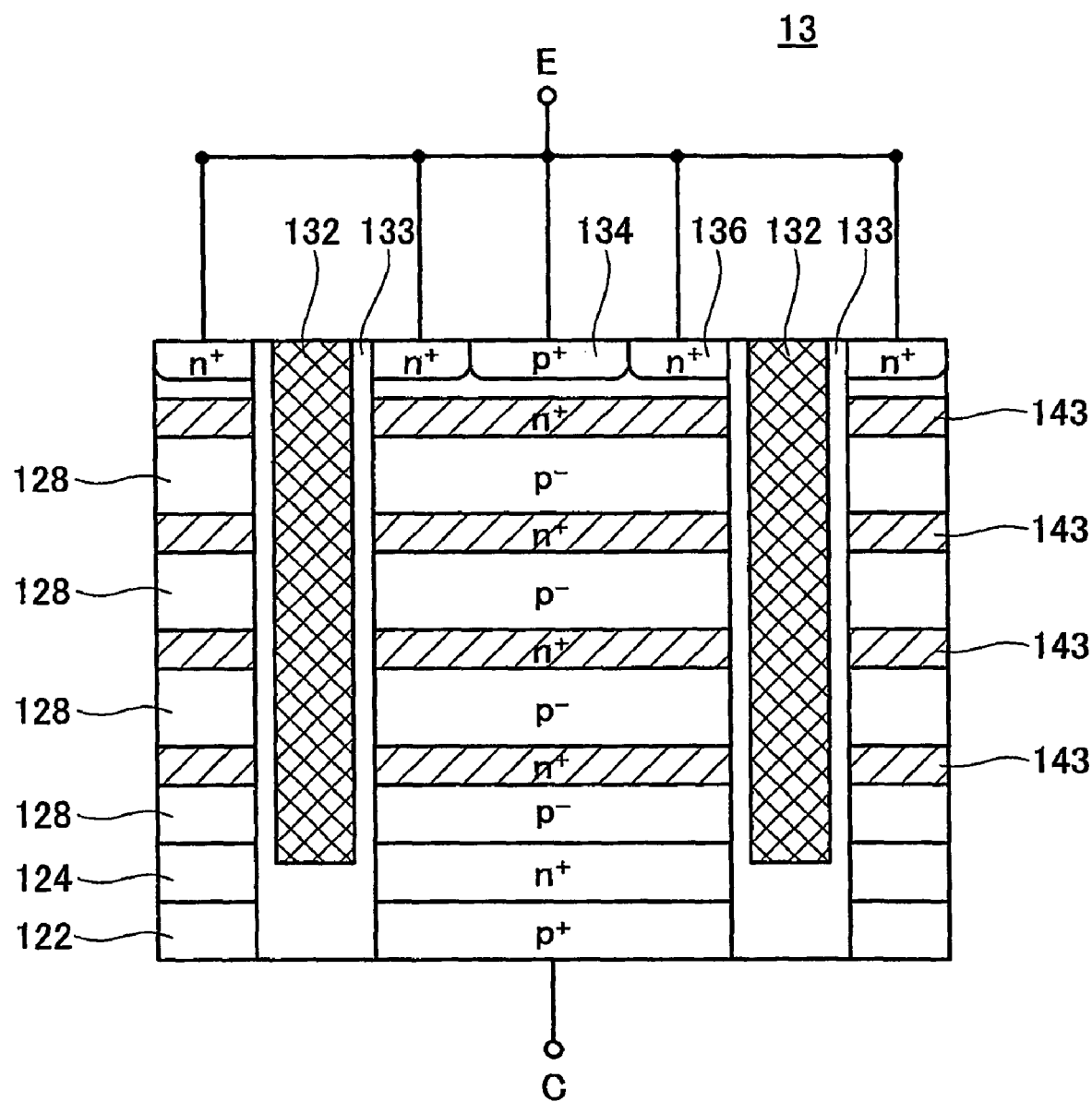
FIG. 15 shows a cross-sectional view of essential parts of a semiconductor device 13 of a twelfth embodiment.

A semiconductor device 13 of a twelfth embodiment, shown in FIG. 15, is not provided with a drift region. Almost the entirety of the semiconductor region corresponds to a body region 128. A plurality of floating semiconductor regions 143 are formed within the body region 128 so as to be formed between the emitter and the collector electrodes. A trench gate electrode 132 is formed from the emitter electrode E side to the collector electrode C side.

A potential barrier is formed at the junction boundary face of each of the plurality of floating semiconductor regions 143 with the body region 128. These potential barriers impede the flow of the hole carriers towards a body contact region 134. The floating semiconductor regions 143 form a barrier region relative to the flow of the hole carriers. By impeding the flow of the hole carriers, the floating semiconductor regions 143 aid the accumulation of hole carriers in the body region 128.

When the semiconductor device 13 is in a turned on state, electron carriers are injected from an emitter region 136 to a buffer region 124 via an inverted layer formed along the trench gate electrode 132. Hole carriers injected from a collector region 122 advance towards the emitter electrode via the body region 128. However, the effect of the floating semiconductor regions 143 in accumulating hole carriers means that the concentration of hole carriers in the body region 128 increases. Consequently, the on-voltage of the semiconductor device 13 is reduced.

Moreover, when the semiconductor device 13 is a turned off state, a depressed layer extends from the pn junction boundary faces between the floating semiconductor regions 143 and the body region 128. As a result, a wider region of the body region 128 is depressed. The semiconductor device 13 achieves high breakdown voltage. Further, this depression means that the hole carriers that have been accumulated in the body region 128 are rapidly dispersed to the emitter electrode. Consequently, the semiconductor device 13 is characterized in having a short turn-off time.

Thirteenth Embodiment

Figure 16:
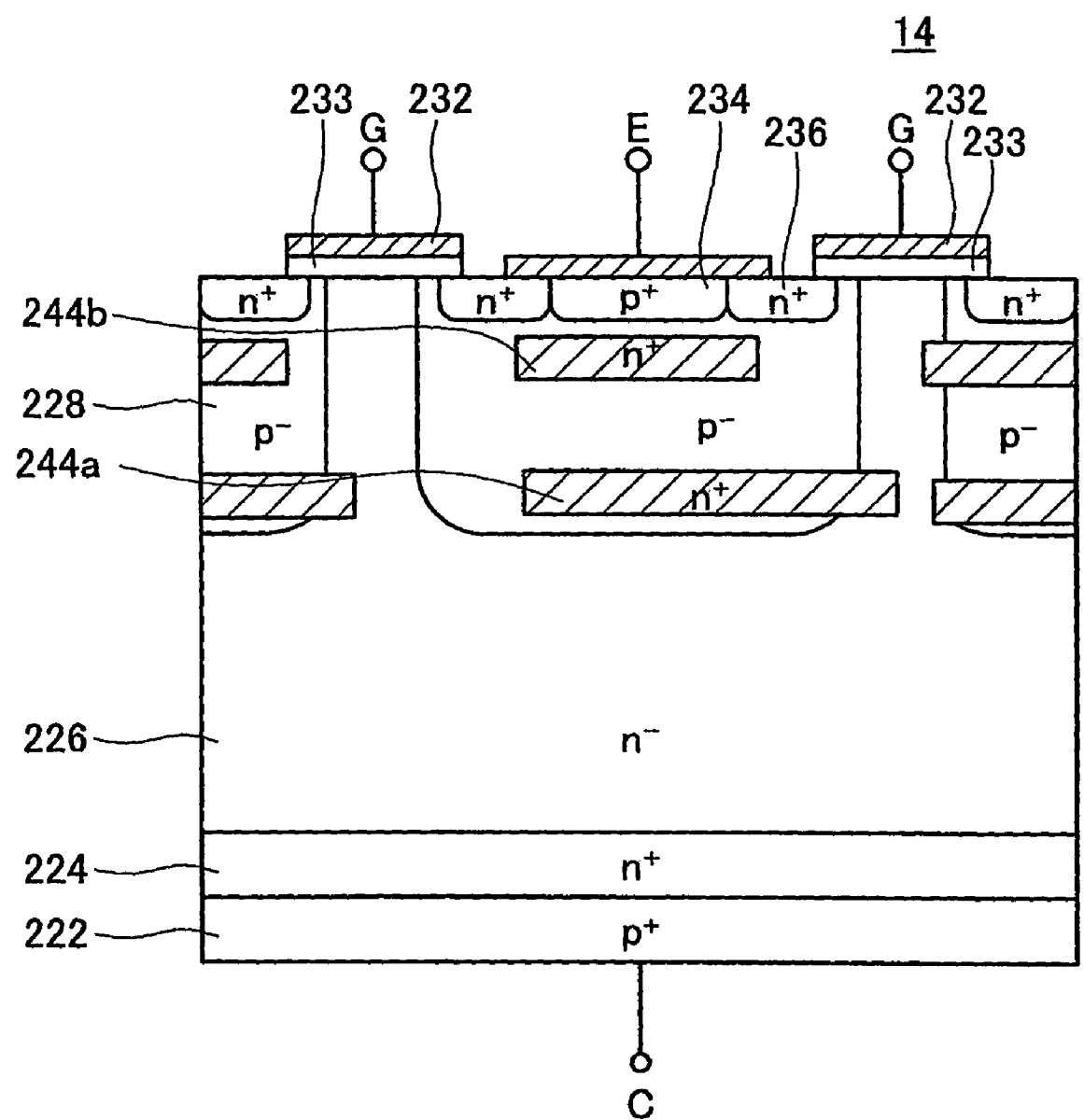
FIG. 16 shows a cross-sectional view of essential parts of a semiconductor device 14 of a thirteenth embodiment.
Figure 17:
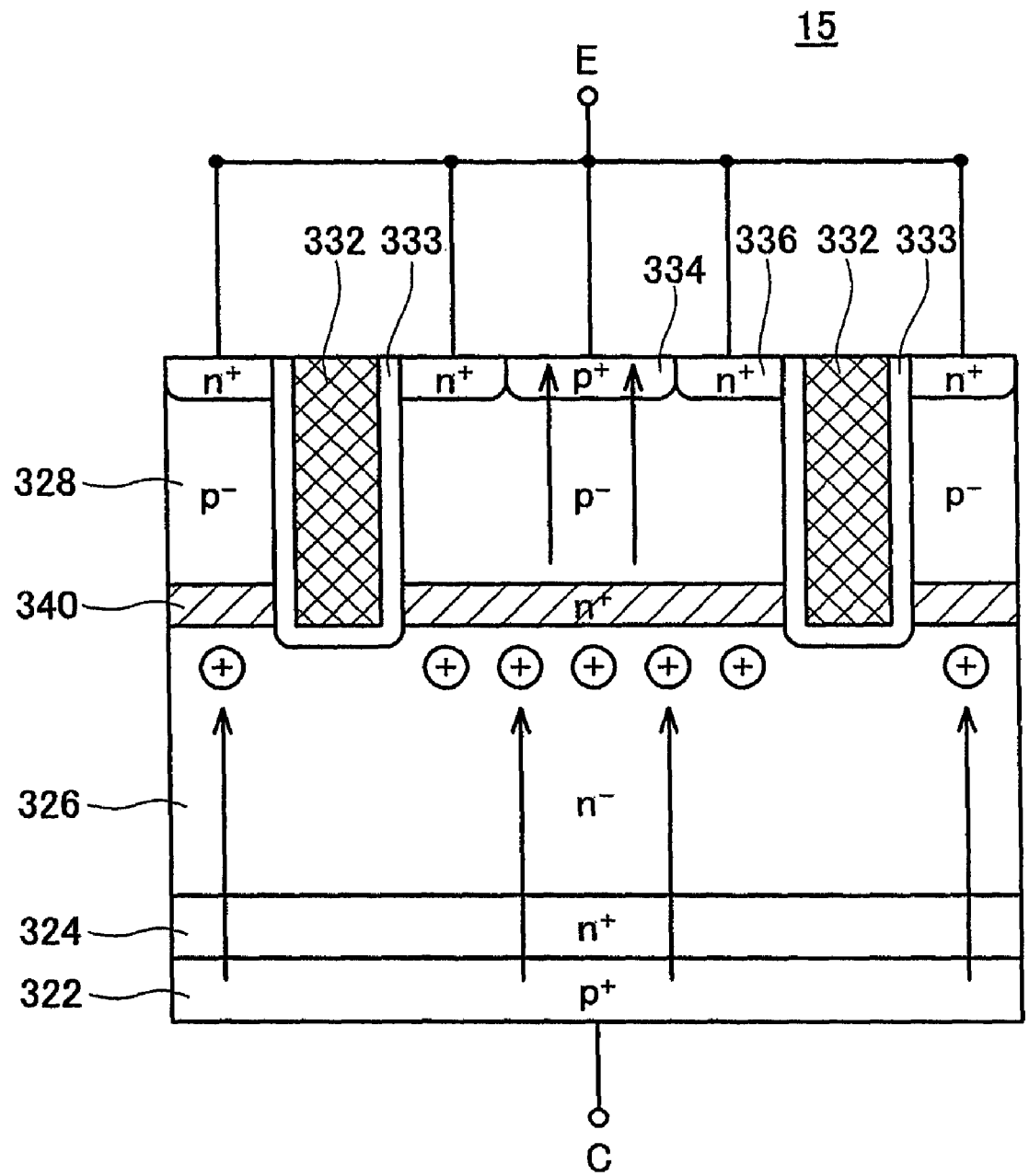
FIG. 17 shows a cross-sectional view of essential parts of a semiconductor device 15 having a conventional configuration.

In a semiconductor device 14 of a thirteenth embodiment, shown in FIG. 16, a gate electrode 232 is a planar type. In this case, semiconductor regions (244b, 244a) are formed in the vicinity of a junction boundary face of a body contact region 234 and a body region 228, and in the vicinity of a junction boundary face of the body region 228 and a drift region 226. Potential barriers are formed at the junction boundary faces of the semiconductor regions 244a and 244b with the body region 228. These potential barriers impede the flow of the hole carriers towards the body contact region 234. The semiconductor regions 244a and 244b form barrier regions relative to the flow of the hole carriers. By impeding the flow of the hole carriers, the semiconductor regions 244a and 244b aid the accumulation of hole carriers in the body region 228. Consequently, the concentration of hole carriers in the body region 228 can be increased, and the on-voltage of the semiconductor device 14 decreases.

The embodiments described above merely illustrate some possibilities of the invention and do not restrict the claims thereof. The art set forth in the claims encompasses various transformations and modifications to the embodiments described above.

For example, the trench gate electrode may be a deep trench type that extends to below the drift region.

Further, the above embodiments have been described with reference to an IGBT semiconductor device. However, similar results can also be obtained using a different device (thyristor, bipolar transistor, power MOSFET) etc.

Furthermore, the technical elements disclosed in the present specification or figures may be utilized separately or in all types of conjunctions and are not limited to the conjunctions set forth in the claims at the time of submission of the application. Furthermore, the art disclosed in the present specification or figures may be utilized to simultaneously realize a plurality of aims or to realize one of these aims.

The invention claimed is:

1. A semiconductor device of IGBT comprising:
an emitter electrode;
a top region of a second conductivity type connected to the emitter electrode;
a deep region of the second conductivity type;
an intermediate region of a first conductivity type isolating the top region and the deep region;
a collector region of the first conductivity type connected to the deep region, the collector region being isolated from the intermediate region by the deep region;
a collector electrode connected to the collector region;
a gate electrode facing a portion of the intermediate region via an insulating layer, the portion of the intermediate region isolating the top region and the deep region; and
a barrier region comprising a semiconductor region of the second conductivity type formed within the intermediate region, wherein the intermediate region comprises a dense portion directly connected to the emitter electrode, and a main portion connected to the emitter electrode via the dense portion, wherein the barrier region is in contact with the dense portion, and is separated from the deep region by the main portion.

2. A semiconductor device according to claim 1, wherein the barrier region further comprises an insulator.

3. A semiconductor device according to claim 1, wherein the thickness of the top region is less than the thickness of the barrier region.

4. A semiconductor device of IGBT comprising:

an emitter electrode;

a top region of a second conductivity type connected to the emitter electrode;

a deep region of the second conductivity type;

an intermediate region of a first conductivity type connected to the emitter electrode, the intermediate region isolating the top region and the deep region;

a collector region of the first conductivity type connected to the deep region, the collector region being isolated from the intermediate region by the deep region;

a collector electrode connected to the collector region;

a gate electrode facing a portion of the intermediate region via an insulating layer, the portion of the intermediate region isolating the top region and the deep region; and a plurality of barrier regions, each comprising a semiconductor region of the second conductive type and formed within the intermediate region;

wherein the barrier regions are distributed within the intermediate region along a direction extending between the top region and the deep region.

5. A semiconductor device according to claim 4, wherein the intermediate region comprises a dense portion directly connected to the emitter electrode, and a main portion connected to the emitter electrode via the dense portion, wherein at least one of the barrier regions is formed in the vicinity of a boundary between the dense portion and the main portion, wherein at least another of the barrier regions is formed in the vicinity of a boundary between the main portion and the deep region, and is electrically disconnected from the emitter electrode and the deep region.

6. A semiconductor device according to claim 5, wherein at least a portion of each of the barrier regions is located on a path along which carriers flow.

7. A semiconductor device according to claim 6, wherein a plurality of pairs of barrier layer and intermediate layer is stacked.

8. A semiconductor device according to claim 4, wherein the intermediate region comprises a dense portion directly connected to the emitter electrode, and a main portion connected to the emitter electrode via the dense portion, wherein at least one of the barrier regions is formed in the vicinity of a boundary between the dense portion and the main portion, wherein at least another of the barrier regions is formed at a boundary between the main portion and the deep region, and has a higher concentration of impurities than the deep region.

9. A semiconductor device according to claim 8, wherein at least a portion of each of the barrier regions is located on a path along which carriers flow.

10. A semiconductor device according to claim 9, wherein a plurality of pairs of barrier layer and intermediate layer is stacked.

11. A semiconductor device according to claim 4, wherein the thickness of the top region is less than the thickness of the barrier region.

* * * * *